(12) United States Patent
Yamazaki et al.

(10) Patent No.: US 9,773,461 B2
(45) Date of Patent: Sep. 26, 2017

(54) DISPLAY MODULE, AND CELLULAR PHONE AND ELECTRONIC DEVICE PROVIDED WITH DISPLAY MODULE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Hajime Kimura, Kanagawa (JP); Atsushi Umezaki, Kanagawa (JP); Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 229 days.

(21) Appl. No.: 14/620,448

(22) Filed: Feb. 12, 2015

(65) Prior Publication Data
US 2015/0228230 A1   Aug. 13, 2015

Related U.S. Application Data

(60) Continuation of application No. 13/530,321, filed on Jun. 22, 2012, now Pat. No. 8,957,833, which is a
(Continued)

(30) Foreign Application Priority Data

Aug. 12, 2005   (JP) ................. 2005-235002

(51) Int. Cl.
*G09G 3/20*   (2006.01)
*G09G 3/36*   (2006.01)
(Continued)

(52) U.S. Cl.
CPC ........... *G09G 3/36* (2013.01); *G02F 1/13318* (2013.01); *G02F 1/13452* (2013.01);
(Continued)

(58) Field of Classification Search
None
See application file for complete search history.

(56) References Cited

U.S. PATENT DOCUMENTS 5,896,575 A   4/1999   Higginbotham et al.
6,204,895 B1 *  3/2001   Nakamura et al. ........... G02F 1/133526
                                                                   349/187
(Continued)

FOREIGN PATENT DOCUMENTS

EP   0881617 A   12/1998
EP   0911676 A   4/1999
(Continued)

OTHER PUBLICATIONS

Lee.K et al.; "QCIF Full Color Transparent AMOLED Display", SID Digest '03 : SID International Symposium Digest of Technical Papers, May 1, 2003, vol. 34, No. 1, pp. 104-107.
(Continued)

*Primary Examiner* — Amr Awad
*Assistant Examiner* — Andre Matthews
(74) *Attorney, Agent, or Firm* — Fish & Richardson P.C.

(57) ABSTRACT

It is an object to achieve downsizing and a thin shape of a display module and an electronic device provided with the display module. The display module includes a first display panel in which a first display screen is formed on one main side; and a second display panel that is smaller than and overlapped with the first display panel, in which a second display screen is formed on an opposite side of the one main side. The display module includes, over a sealing substrate of the first display panel and/or the second display panel, at least one integrated circuit, which is connected to input terminals of the first display panel and the second display panel and controls operation of the both panels, arranged in
(Continued)

a peripheral portion of the second display panel, which is a surface on an opposite side of a display surface of the first display panel.

24 Claims, 18 Drawing Sheets

Related U.S. Application Data division of application No. 11/464,015, filed on Aug. 11, 2006, now Pat. No. 8,207,908.

(51) Int. Cl.
| | |
|---|---|
| G09G 3/30 | (2006.01) |
| G02F 1/133 | (2006.01) |
| G02F 1/1333 | (2006.01) |
| G02F 1/1345 | (2006.01) |
| H01L 27/32 | (2006.01) |
| G09G 5/18 | (2006.01) |

(52) U.S. Cl.
CPC ......... *G02F 1/133385* (2013.01); *G09G 3/20* (2013.01); *G09G 3/30* (2013.01); *G09G 5/18* (2013.01); *H01L 27/3267* (2013.01); *G02F 2001/133342* (2013.01); *G09G 2300/0426* (2013.01); *G09G 2300/0809* (2013.01); *G09G 2310/0267* (2013.01); *G09G 2310/0275* (2013.01); *G09G 2320/041* (2013.01)

(56) References Cited

U.S. PATENT DOCUMENTS

| | | | |
|---|---|---|---|
| 6,249,267 | B1 | 6/2001 | Ishihara |
| 6,466,202 | B1 | 10/2002 | Suso et al. |
| 6,574,487 | B1 | 6/2003 | Smith et al. |
| 6,697,083 | B1 | 2/2004 | Yoon |
| 6,740,938 | B2 | 5/2004 | Tsunoda et al. |
| 7,019,458 | B2 | 3/2006 | Yoneda |
| 7,034,452 | B2 | 4/2006 | Kim |
| 7,167,141 | B2 | 1/2007 | Goto et al. |
| 7,221,338 | B2 | 5/2007 | Yamazaki et al. |
| 7,495,738 | B2 | 2/2009 | Okuda |
| 7,623,098 | B2 | 11/2009 | Yamazaki et al. |
| 7,623,099 | B2 | 11/2009 | Yamazaki et al. |
| 7,623,100 | B2 | 11/2009 | Yamazaki et al. |
| 7,990,348 | B2 | 8/2011 | Yamazaki et al. |
| 2001/0030511 | A1 | 10/2001 | Yamazaki et al. |
| 2001/0046025 | A1 | 11/2001 | Ishii et al. |
| 2002/0111195 | A1 | 8/2002 | Kweon et al. |
| 2002/0113760 | A1* | 8/2002 | Kimura ................ G09G 3/3233 345/82 |
| 2002/0149053 | A1 | 10/2002 | Tsunoda et al. |
| 2002/0158999 | A1 | 10/2002 | Shima |
| 2003/0063041 | A1* | 4/2003 | Kurashima et al. ................ G02F 1/13452 345/1.1 |
| 2003/0142244 | A1 | 7/2003 | Kato |
| 2003/0189528 | A1 | 10/2003 | Antila et al. |
| 2003/0193288 | A1 | 10/2003 | Pavlovsky |
| 2003/0214467 | A1 | 11/2003 | Koyama et al. |
| 2004/0075628 | A1 | 4/2004 | Chien et al. |
| 2004/0124542 | A1 | 7/2004 | Kuwabara et al. |
| 2004/0130897 | A1 | 7/2004 | Kojima et al. |
| 2004/0135741 | A1 | 7/2004 | Tomisawa et al. |
| 2004/0201545 | A1 | 10/2004 | Yamazaki et al. |
| 2004/0207569 | A1 | 10/2004 | Ho et al. |
| 2004/0212012 | A1 | 10/2004 | Yamazaki et al. |
| 2004/0238827 | A1 | 12/2004 | Takayama et al. |
| 2005/0001211 | A1 | 1/2005 | Yamazaki et al. |
| 2005/0078446 | A1 | 4/2005 | Bae |
| 2005/0140265 | A1 | 6/2005 | Hirakata |
| 2005/0156811 | A1* | 7/2005 | Ikeda et al. ............. G06F 3/147 345/1.1 |
| 2005/0253773 | A1 | 11/2005 | Sekiguchi |
| 2005/0259093 | A1 | 11/2005 | Osame et al. |
| 2006/0033865 | A1 | 2/2006 | Tanaka et al. |
| 2006/0108588 | A1 | 5/2006 | Osame et al. |
| 2006/0232495 | A1 | 10/2006 | Chang et al. |
| 2007/0109215 | A1 | 5/2007 | Goto et al. |
| 2008/0054265 | A1 | 3/2008 | Osame et al. |
| 2009/0237390 | A1 | 9/2009 | Koyama et al. |
| 2011/0140997 | A1 | 6/2011 | Yamazaki et al. |

FOREIGN PATENT DOCUMENTS

| | | |
|---|---|---|
| EP | 1148466 A | 10/2001 |
| EP | 1431802 A | 6/2004 |
| EP | 2242038 A | 10/2010 |
| GB | 2349784 | 11/2000 |
| GB | 2364462 | 1/2002 |
| GB | 2376616 | 12/2002 |
| JP | 05-081874 | 11/1993 |
| JP | 07-199824 A | 8/1995 |
| JP | 09-223820 A | 8/1997 |
| JP | 2001-086205 A | 3/2001 |
| JP | 2001-285445 A | 10/2001 |
| JP | 2001-345184 A | 12/2001 |
| JP | 2002-323873 A | 11/2002 |
| JP | 2002-333861 A | 11/2002 |
| JP | 2003-023161 A | 1/2003 |
| JP | 3408154 | 5/2003 |
| JP | 2003-228304 A | 8/2003 |
| JP | 2003-295213 A | 10/2003 |
| JP | 2003-330419 A | 11/2003 |
| JP | 2004-047458 A | 2/2004 |
| JP | 2004-061892 A | 2/2004 |
| JP | 2004-062047 A | 2/2004 |
| JP | 2004-151370 A | 5/2004 |
| JP | 2004-151513 A | 5/2004 |
| JP | 2004-240090 A | 8/2004 |
| JP | 2004-258450 A | 9/2004 |
| JP | 2004-260433 A | 9/2004 |
| JP | 2004-264516 A | 9/2004 |
| JP | 2005-070121 A | 3/2005 |
| JP | 2005-071693 A | 3/2005 |
| JP | 2005-084642 A | 3/2005 |
| JP | 2005-156766 A | 6/2005 |
| JP | 2005-173000 A | 6/2005 |
| JP | 2005-265924 A | 9/2005 |
| JP | 2006-301561 A | 11/2006 |
| TW | 200705027 | 2/2007 |
| WO | WO-97/22904 | 6/1997 |
| WO | WO-2004/029918 | 4/2004 |

OTHER PUBLICATIONS

Exhibition of Active Matrix Type Organic EL Display at 13th Flat Panel Display Manufacturing Technology Expo & Conference, Jul. 2, 2003, by Eldis Group.

Documents distributed in the "13th Flat Panel Display Manufacturing Technology Expo & Conference", Jul. 2, 2003, by Eldis Group.

Two-Way Display Developed, The Japan Times, Jul. 3, 2003.

Mass Production of Organic EL Devices, Shimotsuke Newspaper, Jul. 3, 2003.

Search Report (Application No. 200401210.0) Dated Mar. 16, 2006.

Search Report (Application No. 06016625.3) Dated May 7, 2007.

Search Report (Application No. 06016625.3) Dated Jul. 19, 2007.

\* cited by examiner

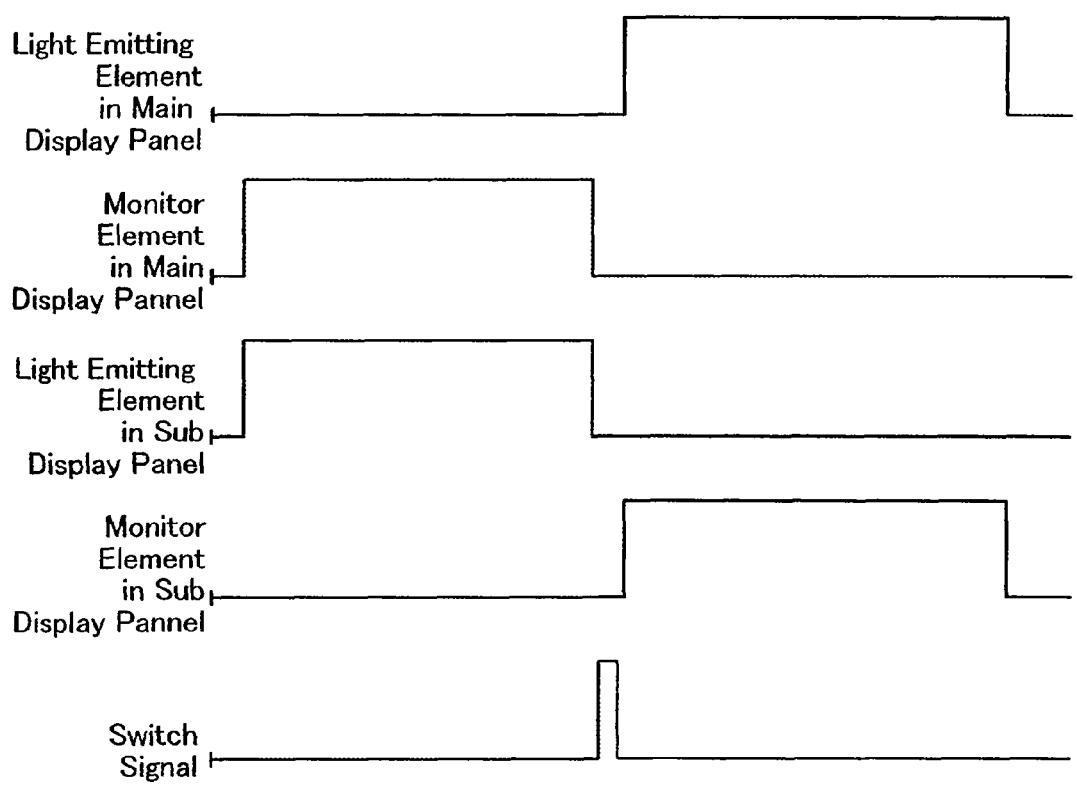

DISPLAY MODULE, AND CELLULAR PHONE AND ELECTRONIC DEVICE PROVIDED WITH DISPLAY MODULE

CROSS-REFERENCE TO RELATED APPLICATIONS

This application is a continuation of U.S. application Ser. No. 13/530,321 filed Jun. 22, 2012, now allowed, which is a divisional of U.S. application Ser. No. 11/464,015, filed Aug. 11, 2006, now U.S. Pat. No. 8,207,908, which claims the benefit of a foreign priority application filed in Japan as Serial No. 2005-235002 on Aug. 12, 2005, all of which are incorporated by reference.

BACKGROUND OF THE INVENTION

1. Field of the Invention

The present invention relates to a display module used in an image display portion and an electronic device provided with the display module.

2. Description of the Related Art

In an image display portion of an electronic device such as a cellular phone, a liquid crystal display module which forms an image using a liquid crystal panel is used. In addition, a display module using an organic electroluminescence panel instead of the liquid crystal panel has also been put in a practical use.

A display module is formed by connecting a display panel including a liquid crystal or an organic EL element and a circuit substrate on which a driver IC or a power supply IC is mounted with a flexible wiring board. In the flexible wiring board, a wiring pattern is formed over a resin film, and a driver IC may also be directly mounted thereon.

An electronic device such as a cellular phone has become higher functional, and an electronic device provided with a main screen and a sub-screen on both sides of a folding type chassis and further provided with a digital still camera or a video camera is mainly used (see Reference 1: Japanese Patent Application Laid-Open No: 2004-260433).

In accordance with higher function and higher added value in an electronic device such as a cellular phone, the number of components to be stored in a chassis is increased, and a proportion of a printed board on which various IC chips or CCD cameras are mounted cannot be ignored. On the contrary, downsizing, a thin shape, and lightweight of an electronic device such as a cellular phone are required, and an antinomy relation to the higher added value is formed.

SUMMARY OF THE INVENTION

In view of the foregoing conditions, it is an object of the present invention to achieve downsizing and a thin shape of a display module and an electronic device into which the display module is incorporated.

According to one feature of the present invention, a display module includes a first display panel in which a plurality of dots is arranged and a first display screen is formed on one main side; and a second display panel that is smaller than and overlapped with the first display panel, in which a plurality of dots is arranged and a second display screen is formed on an opposite side of the one main side. The display module further includes a wiring board, which is connected to input terminals of the first display panel and the second display panel and provided with an integrated circuit controlling operation of the both panels, arranged in a peripheral portion of the second display panel, which is a surface on an opposite side of a display surface of the first display panel.

According to another feature of the present invention, a display module includes a first display panel in which a plurality of dots is arranged and a first display screen is formed on one main side; and a second display panel that is smaller than and overlapped with the first display panel, in which a plurality of dots is arranged and a second display screen is formed on an opposite side of the one main side. The display module further includes, over a sealing substrate of the first display panel and/or the second display panel, at least one integrated circuit, which is connected to input terminals of the first display panel and the second display panel and controls operation of the both panels, arranged in a peripheral portion of the second display panel, which is a surface on an opposite side of a display surface of the first display panel.

According to another feature of the present invention, a display module includes a first display panel in which a plurality of dots is arranged over a first substrate and a first display screen is formed on one main side; a second display panel that is smaller than the first substrate, in which a second plurality of dots is arranged and a second display screen is formed on an opposite side of the one main side; and a sealing substrate which is arranged between the first substrate and a second substrate to be opposed to the substrates and seals the first display screen and the second display screen. The display module further includes, over the sealing substrate, an integrated circuit, which is connected to input terminals of the first display panel and the second display panel and controls operation of the both panels, arranged in a peripheral portion of the second substrate, which is a surface on an opposite side of a display surface of the first substrate.

According to another feature of the present invention, a display module includes a first display panel in which a plurality of dots is arranged over a first substrate and a first display screen is formed on one main side; a second display panel that is smaller than the first substrate, in which a second plurality of dots is arranged and a second display screen is formed on an opposite side of the one main side; and a sealing substrate which is arranged between the first substrate and a second substrate to be opposed to the substrates and seals the first display screen and the second display screen. The display module further includes, over the sealing substrate, at least one integrated circuit which is connected to input terminals of the first display panel and the second display panel and controls operation of the both panels.

In the display module, a diagonal dimension of the first display screen and a diagonal dimension of the second display screen are different, and a combination in which a diagonal dimension of one display screen is larger than that of the other is allowed. In addition, the number of dots in the first display screen and the number of dots in the second display screen are different, and a combination in which the number of dots in one display screen is larger than that in the other is allowed.

The display module may include, as an integrated circuit to be mounted, one or both of a controller which sends a video signal to the first display screen and the second display screen and a power supply circuit. One or both of the controller and the power supply circuit can be used in common in the first display panel and the second display panel.

According to another feature of the present invention, a cellular phone in which a main screen and a sub-screen are formed by using the first display panel and the second display panel of the display module is provided.

According to another feature of the present invention, an electronic device in which at least two screens are formed by using the first display panel and the second display panel of the display module is provided.

In the present specification, a display module refers to a display module including a plurality of display panels and a circuit portion, on which electronic components, which are necessary for operation of the display panels or an electronic device into which the display panels are incorporated, are mounted.

In the present specification, an electronic device refers to all devices using a display module as a display means to display images including characters, graphics, symbols, and the like. As examples of such electronic devices, a cellular phone, a personal computer, a portable information terminal (including a function of downloading contents such as images, document, or music from a network, and reproducing them), an electronic notebook, a monitor, a video game machine, a camera such as a digital camera or a video camera, a view-finder, and the like are given, and various devices further having peculiar features to the devices are also given.

In accordance with the present invention, display surfaces of a plurality of display panels having different areas are arranged back to back. Further, electronic components, which are necessary for operation of the display panels or an electronic device into which the display panels are incorporated, are mounted on a back side of the display panel having a larger area (that is, in the periphery of the display panel having a smaller area). Therefore, the display module can be downsized. In addition, since a printed board used conventionally is not used, a thin shape of the display module can be achieved.

In accordance with the present invention, in addition to advantageous effect as described above, downsizing and a thin shape of a cellular phone and a display screen electronic device provided with a plurality of display screens can be achieved.

BRIEF DESCRIPTION OF THE DRAWINGS

In the accompanying drawings:

FIG. 17 is a diagram explaining operation of a display module according to Embodiment Mode 7.

DESCRIPTION OF THE INVENTION

Figure 1:
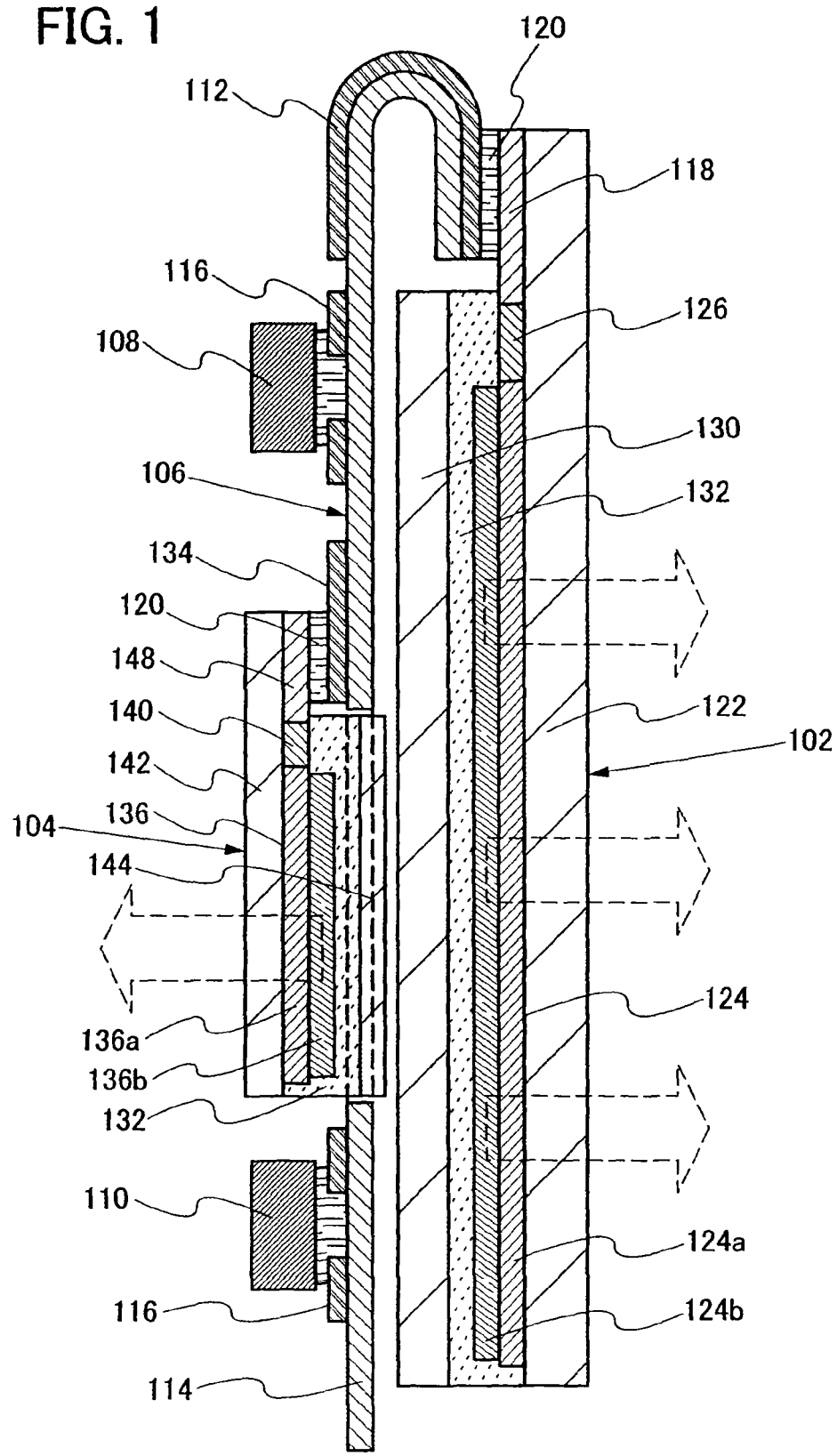
FIG. 1 is a view showing a structure of a display module according to Embodiment Mode 1.

Embodiment modes of the present invention will be described in detail with reference to the accompanying drawings. It is to be noted that the present invention is not limited to the following description, and it is easily understood by those skilled in the art that modes and details thereof can be modified in various ways without departing from the purpose and the scope of the invention. Therefore, the present invention should not be interpreted as being limited to the description of the embodiment modes to be given below. Further, in a structure of the present invention, which will be described below, the same reference numerals are used for the same portions or portions having the same functions in different drawings and a repeated description in such a case will be omitted.

Embodiment Mode 1

Figure 2:
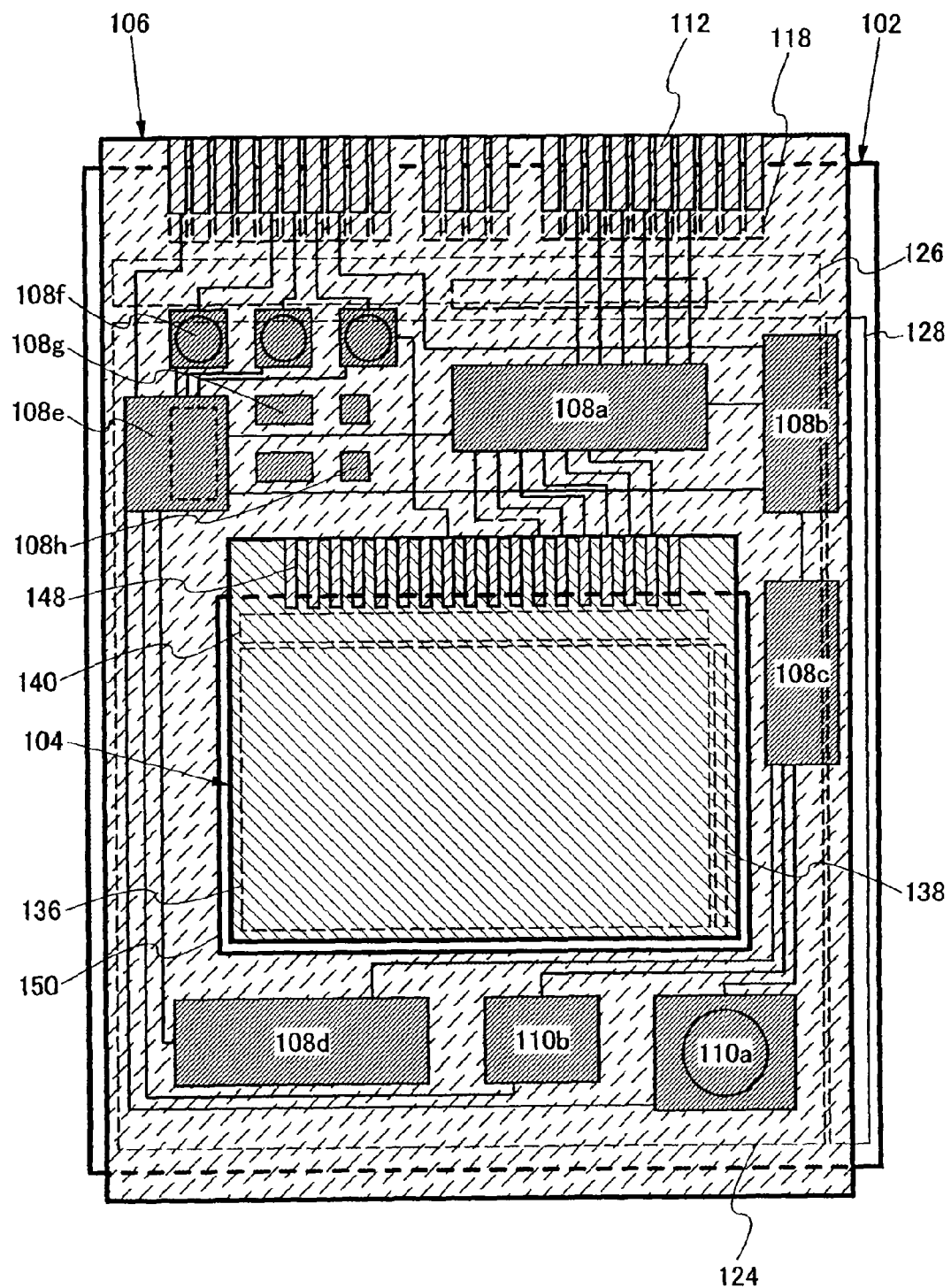
FIG. 2 is a view showing a structure of a display module according to Embodiment Mode 1.

FIGS. 1 and 2 are views each showing a structure of a display module according to Embodiment Mode 1. FIG. 2 is a top view of the display module from one side and FIG. 1 is a cross-sectional view. Hereinafter, the description will be given with reference to the both drawings.

The display module according to this embodiment mode includes a first display panel 102, a second display panel 104, and a signal processing circuit substrate 106 including a controller of the both display panels. The first display panel 102 and the second display panel 104 are provided so that images including characters, graphics, and symbols are displayed on different sides. In addition, the first display panel 102 and the second display panel 104 are different in screen size, and one display panel forms a main screen and the other display panel forms a sub-screen.

In this case, external dimensions of the first display panel 102 and the second display panel 104 are made to be different from each other, and, as compared with one display panel, the external dimension (i.e. a panel area) of the other display panel is made to be smaller. Typically, the second display panel 104 forming the sub-screen is made to be smaller than the first display panel 102 forming the main screen. In addition, in order to form a compact display module, the first display panel 102 and the second display panel 104 are arranged back to back so as to be in close contact or adjacent to each other. In other words, the second display panel 104 is arranged in an inner side of the screen of the first display panel 102.

The signal processing circuit substrate 106 is connected to a terminal 118 of the first display panel 102 through a conductive member 120 by using a first terminal 112. An anisotropic conductive material has three functions of adhesion, conductivity, and insulation. In particular, a high molecular material called an ACF (anisotropic conductive film) or an ACP (anisotropic conductive paste) has electrical continuity in a thickness direction and an insulating property in a plane direction by thermocompression bonding processing.

When the conductive member 120 is interposed between the first terminal 112 and the terminal 118, electric resistance between the both terminals is lowered, and an electrical anisotropic property is obtained so as to electrically insulate the adjacent terminals. Such a conductive member 120 can be provided by using, for example, a resin medium in which conductive fine particles (or fine particles having a conductive surface) are dispersed at such a concentration that the conductive fine particles are localized so as not to mutually influence each other. In this case, when the first terminal 112 and the terminal 118 are provided at an interval that is as large as the conductive fine particle, electrical continuity between the both terminals can be obtained.

The signal processing circuit substrate 106 has a surface where wirings 116 are extended from connecting portions thereof and an IC chip 108 and/or a sensor chip 110 are/is mounted. The IC chip 108 and the sensor chip 110 are prepared as individual components and mounted so as to form electrical connection with connecting portions of the wirings 116 that are appropriately arranged. The IC chip 108 and the sensor chip 110 are mounted by a connecting method such as face down bonding or wire bonding. The mounted surface is arranged so as to be overlapped with the first display panel 102. In this case, a second terminal 134 which forms electrical connection with a terminal 148 of the second display panel 104 is arranged above the first display panel 102. As described above, a surface on the opposite side of a display surface of the first display panel 102 is effectively utilized; thus, the display module can be formed to be compact.

As described above, in order to form the mounted surface successively from the first terminal 112 which forms electrical connection with the terminal 118 of the first display panel 102, the signal processing circuit substrate 106 is preferably formed by using a flexible substrate 114 which forms an insulating surface. As the flexible substrate 114, a polyimide film is typically employed; however, other resin films or fiber-reinforced plastics may also be used. A thickness of the flexible substrate 114 may be 30 to 300 μm, typically 80 to 160 μm. When the second display panel 104 arranged in an inner side of the signal processing circuit substrate 106 is thicker than the signal processing circuit substrate 106, an opening 105 which hollows out part of the signal processing circuit substrate 106 may be provided so that the second terminal 134 may be overlapped with the terminal 148 of the second display panel 104.

As examples of the IC chip 108 which is mounted on the mounted surface of the signal processing circuit substrate 106, various circuits such as a driver circuit of a display panel, a controller, a sound or image signal processing circuit, a memory, a power supply circuit, a radio-frequency circuit, a filter, a security circuit, a central processing unit (CPU), an amplifier circuit, and an interface circuit for connecting other external device such as optical communication, LAN, or USB are given. In addition, as the sensor chip 110, various sensors such as a photo-sensor, a CCD module (a camera), a temperature sensor, a humidity sensor, an acceleration sensor, a vibration sensor, a direction sensor, a gas sensor, and a particulate sensor (such as a smoke sensor or a pollen sensor) can be employed.

FIG. 2 shows a controller 108a which controls a signal to be sent to the display panel, a sound and image processor 108b which controls a signal to be sent to the controller 108a, a CPU 108c, and a memory 108d as components mounted on the signal processing circuit substrate 106. In addition, as a power supply system, a power supply circuit 108e, an electric power transistor 108f, a condenser 108g, a coil 108h, and the like can also be mounted. Besides, a driver IC (for driving a scanning line or driving a signal line) for the first display panel 102 and the second display panel 104 can also be mounted here. The controller 108a selects a target to which a signal is sent using a switch or a program and is used in common in the first display panel 102 and the second display panel 104; thus, the number of components is reduced, and a preferable mode can be obtained. The CPU 108c controls a signal from the sensor chip 110 or a key input signal, and controls the power supply system.

In addition, as the sensor chip 110, a CCD module 110a and a photo-sensor 110b are mounted. The CCD module 110a is used as an input device which captures a still image or a moving image as a so-called digital camera. Further, the photo-sensor 110b adjusts brightness of the display panel by detecting external light intensity and can be used as a photometer when the CCD module 110a is used.

In the first display panel 102, a display portion 124 and the terminal 118 are formed over a first substrate 122. Besides, a scanning line driver circuit 128 and a signal line driver circuit 126 may also be formed. Obviously, part or all of these driver circuits may be mounted on the signal processing circuit substrate 106 as an IC chip as described above. In the display portion 124, a plurality of pixels which are the minimum units of image display is arranged two-dimensionally in an X direction and a Y direction. The display portion 124 includes a driving element array 124a and a display element array 124b as components. When further subdivided, the driving element array 124a includes a switching element which controls ON and OFF of a signal, and a non-linear element which controls a current flow may also be combined as needed.

The scanning line driver circuit 128 and/or the signal line driver circuit 126 can be manufactured by using the same element as that of the driving element array 124a. A transistor, more preferably a thin film transistor (hereinafter referred to as a TFT) is usually used as the element in this case. In addition, a capacitor element, a resistive element, or an inductor element may also be included as a matter of course. The terminal 118 is also formed by using the same conductive layer as that of an electrode or a wiring of these elements.

As a typical switching element, a transistor is usually used. A transistor can have a single-drain structure in which a channel forming region is provided between a pair of a source and a drain, an LDD structure in which a low-concentration drain (LDD) is provided between a channel forming region and a drain, or the like. A transistor may also have a multi-gate structure in which a plurality of gate electrodes is interposed (a plurality of channel forming regions is arranged in series) between a pair of a source and a drain. In addition, single crystal silicon, polycrystal silicon, or amorphous silicon can be used for a semiconductor layer included in a transistor. As a structure of a transistor, a top-gate type in which a gate electrode is formed after forming a semiconductor layer may be employed as well as a bottom-gate type in which a semiconductor layer is formed after forming a gate electrode. In particular, the latter case is desirable in a case of using amorphous silicon.

The display element array 124b can be formed by using an element in which optic characteristics are changed by electric action (for example, a liquid crystal element in which a liquid crystal material is interposed between a pair of electrodes), an element which emits light by carrier injection (such as an electroluminescence element (hereinafter also referred to as an EL element), a light-emitting diode, or a light-emitting transistor), an element which discharges an electric charge (such as an electron source element), or the like.

In the second display panel 104, a display portion 136 and the terminal 148 are formed over a second substrate 142. Besides, a scanning line driver circuit 138 and a signal line driver circuit 140 may also be formed. A driving element array 136a and a display element array 136b in the display portion 136 each have the same structure as that in the first display panel 102. With respect to the first display panel 102 and the second display panel 104, the display portions can be formed by using the same kind of driving element arrays and display element arrays, or may be formed by using different kinds of driving element arrays and display element arrays. For example, the display element arrays in both the first display panel 102 and the second display panel 104 can be formed by using EL elements, or one of them may be formed by using a liquid crystal element. In order to reduce the number of chips mounted on the signal processing circuit substrate 106, it is preferable to use chip components in common in the first display panel 102 and the second display panel 104. In such a case, it is preferable to use the same kind of driving element arrays and display element arrays as in the case of forming the display element arrays both with EL elements.

Various combinations may be applied to the first display panel 102 and the second display panel 104. For example, the driving element array 124a of the first display panel 102 can be formed by using a TFT to obtain a so-called active matrix driving panel, and the second display panel 104 can also be the active matrix driving panel. In this combination, the driving element array 136a of the second display panel 104 may be omitted to obtain a simple matrix panel or a segment display panel.

The first display panel 102 and the second display panel 104 can be made to be different in screen size and number of dots. For example, in a usage as a cellular phone, the first display panel 102 can be a 2.4-inch type having the number of dots of 320×240 as a QVGA (the number of pixels of 320×240×3 (RGB)), and the second display panel 104 can be a 1.1-inch type having the number of dots of 128×96. In addition, in a usage as a computer provided with an open/close type display screen such as a notebook computer, the first display panel 102 can be a 15-inch type having the number of dots of 1024×768 as an XGA (the number of pixels of 1024×768×3 (RGB)), and the second display panel 104 can be a 3-inch type having the number of dots of 320×240 as a QVGA. Besides, the screen sizes and the number of dots of the first display panel 102 and the second display panel 104 can be appropriately combined to be applied to various electronic devices.

In the first display panel 102, at least the display portion 124 is covered with a first sealing substrate 130. The first sealing substrate 130 is fixed to the first substrate 122 with a sealing material 132. This structure is preferably employed in the case of using an EL element for the display element array 124b. The first substrate 122 has a function of keeping the mechanical strength as a flat display panel in addition to a function of fixing the display portion 124, the scanning line driver circuit 128, the signal line driver circuit 126, and the terminal 118 by organically connecting them. The mechanical strength refers to a thickness which prevents the display module from being easily broken due to an impact or a vibration when the display module is incorporated into a chassis of an electronic device or the like, or the sufficient strength which prevents the display module from being broken in handling of a device in manufacturing. In this case, when the first substrate 122 has a constant thickness to keep the mechanical strength, the first sealing substrate 130 can be thinner than the first substrate 122. In addition, when the first sealing substrate 130 is made to be thin, the strength may be supplemented by combining a reinforcing material such as a resin film.

Similarly, in the second display panel 104, a second sealing substrate 144 is fixed to the second substrate 142 with the sealing material 132. In this case, when the second substrate 142 has a constant thickness to keep the mechanical strength, the second sealing substrate 144 can be thinner than the second substrate 142. In addition, when the second display panel 104 is smaller than the first display panel 102, the second substrate 142 can be thinner than the first substrate 122, and the second sealing substrate 144 can be thinner than the first sealing substrate 130.

When the first sealing substrate 130 of the first display panel 102 and the second sealing substrate 144 of the second display panel 104 are in close contact with each other, the both sealing substrates can be further thinned. Alternatively, the sealing substrate of the second display panel 104 may be omitted, and the first sealing substrate 130 may be used in common in the first display panel 102 and the second display panel 104.

For example, the first substrate 122 and the first sealing substrate 130 are each formed by using a glass substrate having a thickness of 0.5 mm, the second substrate 142 is formed by using a glass substrate having a thickness of 0.5 mm, and the second sealing substrate 144 is formed by using a glass substrate having a thickness of 0.3 mm. Then, the total thickness is 1.8 mm. In consideration of the flexible substrate 114 having a thickness of 30 to 300 µm, the total thickness is approximately 2 mm. Also in consideration of thicknesses of the driving element array and the display element array in the display portion and the sealing material, the total thickness thereof is less than 1 mm. Therefore, a thickness of the display module in this embodiment mode can be 3 mm or less. In a display module, a thickness of a glass substrate, which influences the thickness most, is required to be determined in consideration of the display panel size, but can be freely selected from a range of 0.1 to 2 mm, preferably 0.4 to 0.7 mm.

As described above, display surfaces of a plurality of display panels having different areas are arranged back to back. Further, electronic components, which are necessary for operation of the display panels or an electronic device into which the display panels are incorporated, are mounted on a back side of the display panel having a larger area (that is, in the periphery of the display panel having a smaller area). Therefore, the display module can be downsized. In addition, since a printed board used conventionally is not used, a thin shape of the display module can be achieved.

Embodiment Mode 2

Figure 3:
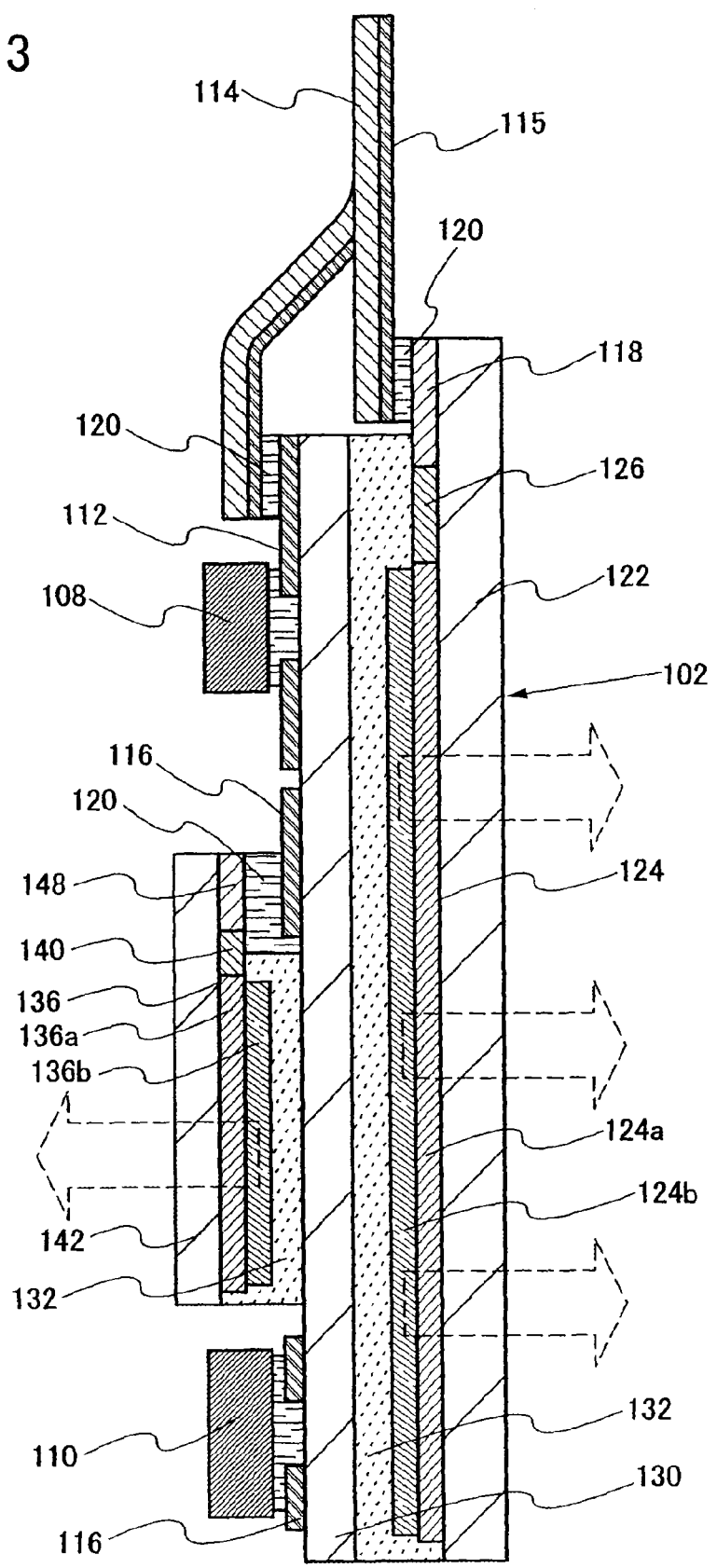
FIG. 3 is a view showing a structure of a display module according to Embodiment Mode 2.
Figure 4:
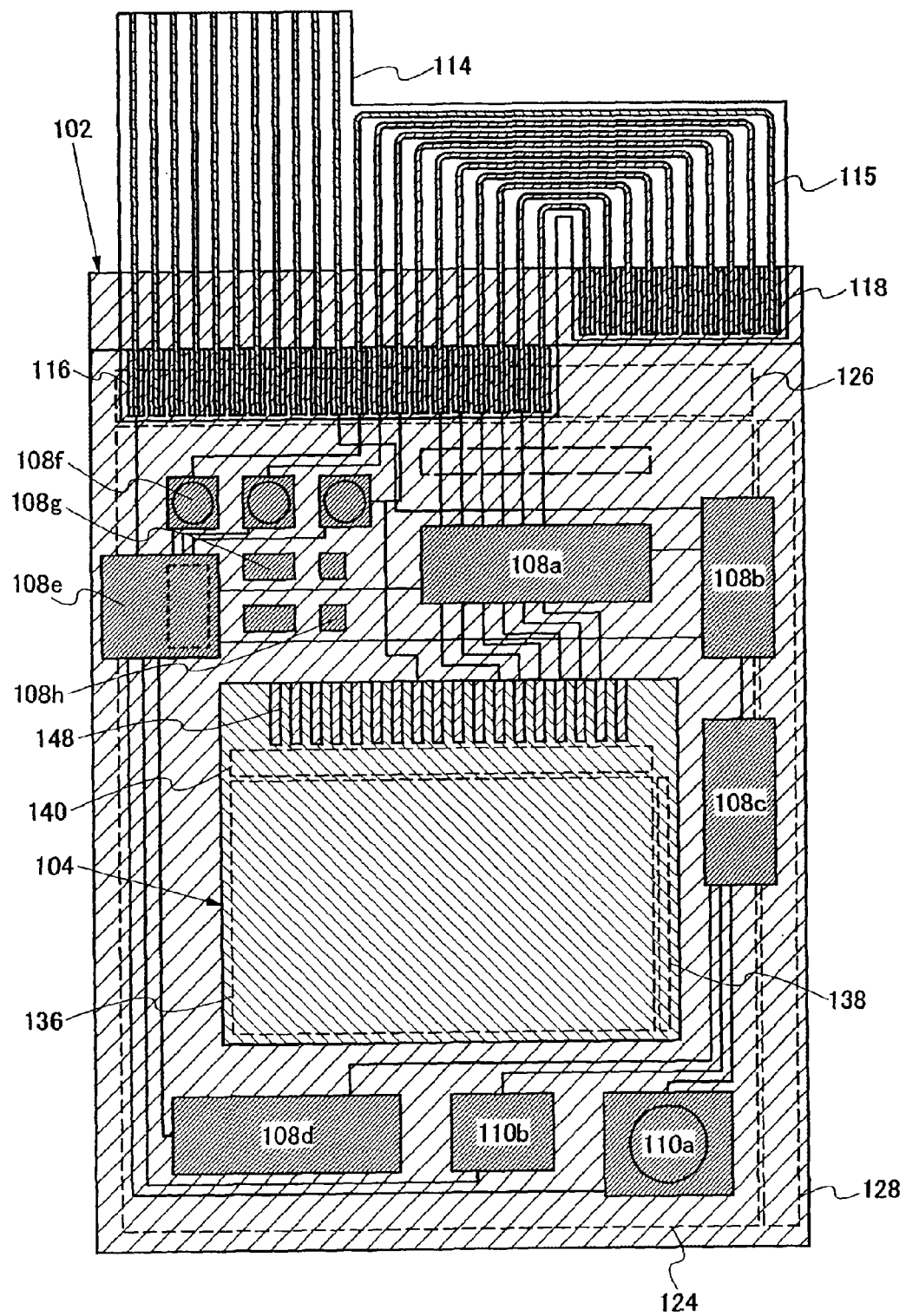
FIG. 4 is a view showing a structure of a display module according to Embodiment Mode 2.

With reference to FIGS. 3 and 4, this embodiment mode will describe a mode of mounting individual components such as an IC chip on a substrate used as a sealing material in order to achieve downsizing and a thin shape of a display module which includes a plurality of display panels forming a main screen and a sub-screen. FIG. 4 is a top view of the display module from one side and FIG. 3 is a cross-sectional view. Hereinafter, the description will be given with reference to the both drawings.

The display module according to this embodiment mode includes a first display panel 102 and a second display panel 104. The first display panel 102 and the second display panel 104 are provided so that images including characters, graphics, and symbols are displayed in different directions. In addition, the first display panel 102 and the second display panel 104 are different in screen size, and one display panel forms a main screen and the other display panel forms a sub-screen. FIGS. 3 and 4 show a case where the second display panel 104 is smaller than the first display panel 102. In this case, the first display panel 102 forms the main screen and the second display panel 104 forms the sub-screen.

In the first display panel 102, a display portion 124 and a terminal 118 are formed over a first substrate 122. Besides, a scanning line driver circuit 128 and a signal line driver circuit 126 may also be formed. In the second display panel 104, a display portion 136 and a terminal 148 are formed over a second substrate 142. Besides, a scanning line driver circuit 138 and a signal line driver circuit 140 may also be formed. These structures are the same as those in Embodiment Mode 1.

In the first display panel 102, at least the display portion 124 is covered with a first sealing substrate 130. A sealing material 132 is filled between the first sealing substrate 130 and the display portion 124, and the first sealing substrate 130 is fixed to the first substrate 122. On the other hand, although the second display panel 104 also has a similar sealing structure, the first sealing substrate 130 of the first display panel 102 is preferably used in common. In other words, in the second display panel 104, the display portion 136 is protected by the first sealing substrate 130 and the sealing material 132. In such a manner, by using a member for protecting the display portion and the like in common, a thin shape and lightweight of the display module can be achieved.

Over the surface of the first sealing substrate 130 surface which is opposite of the surface facing the display portion 124, wirings 116 are formed, and an IC chip 108 and/or a sensor chip 110 are/is mounted. The IC chip 108 and the sensor chip 110 are prepared as individual components and mounted so as to form electrical connection with connecting portions of the wirings 116 that are appropriately arranged. The IC chip 108 and the sensor chip 110 are mounted by a connecting method such as face down bonding or wire bonding. In this case, a second terminal 134 which forms electrical connection with a terminal 148 of the second display panel 104 is arranged above the first display panel 102. As described above, a surface on the opposite side of a display surface of the first display panel 102 is effectively utilized; thus, the display module can be formed to be compact. Herein, the components which are mounted on the first sealing substrate 130 are the same as those in Embodiment Mode 1.

The wiring 116 can be formed by using a conductive layer formed by a printing method, a conductive layer formed by etching a metal thin plate attached to a substrate, a conductive layer formed of a coated film formed by sputtering or evaporation, or the like. In addition, a protective layer coating the wiring 116 may be formed, and a contact portion of a chip component or the like may be exposed.

The first sealing substrate 130, on which the second display panel 104 and the IC chip 108 and/or the sensor chip 110 are mounted, is electrically connected to a wiring 115 formed over a flexible substrate 114 through a conductive member 120 by using a first terminal 112 provided for inputting and outputting a signal. Part of the wiring 115 of the first sealing substrate 130 is also connected to the terminal 118 of the first display panel 102. By this part of the wiring 115 of the first sealing substrate 130, the first display panel 102 can send and receive a signal to/from various circuits mounted on the first sealing substrate 130.

As the first sealing substrate 130, a substrate having an insulating surface at least on one surface is employed to form the wiring 116 thereover. Typically, a glass substrate is used. In addition, a plastic substrate, a metal substrate over which an inorganic or organic insulating film is formed, a ceramic substrate, a fiber-reinforced plastic substrate, or the like can be used. Further, the first sealing substrate 130 on which the IC chip 108 and/or the sensor chip 110 and the second display panel 104 are mounted may be a combination of a printed wiring board or a multilayer printed wiring board and a glass substrate or a plastic substrate.

In the display module of this embodiment mode, any one of the first substrate 122 of the first display panel 102 and the first sealing substrate 130 can be made to be thinner than the other. This is because these two substrates are fixed with the sealing material 132 and at least one of them may be designed to be thick so as to keep the mechanical strength. In addition, the second substrate 142 of the second display panel 104 can be made to be at least thinner than the first substrate 122 of the first display panel 102. This is because the second display panel 104 is a small-screen panel and compact compared with the first display panel 102; thus, the substrate can be thinner.

For example, the first substrate 122 and the first sealing substrate 130 are each formed by using a glass substrate having a thickness of 0.5 mm, and the second substrate 142 is formed by using a glass substrate having a thickness of 0.5 mm. Then, the total thickness is 1.5 mm. It is not necessary to consider a thickness of a printed wiring board on which the IC chip and the like are mounted. In consideration of thicknesses of a driving element array and a display element array in the display portion and the sealing material, the total thickness thereof is less than 1 mm. Therefore, a thickness of the display module in this embodiment mode can be 3 mm or less. In a display module, a thickness of a glass substrate, which influences the thickness most, is required to be determined in consideration of the display panel size, but can be freely selected from a range of 0.1 to 2 mm, preferably 0.4 to 0.7 mm.

In addition, a thickness of the individual component such as an IC chip mounted on the first sealing substrate 130 is 0.05 to 0.6 mm, typically 0.1 to 0.4 mm, and a thickness of the second substrate 142 may be set to be the same as or slightly thicker than, i.e. almost the same as, the thickness of the component. In such a manner, when the display panel and the component which is mounted have the same height, stress is prevented from concentrating on the component such as an IC chip, thereby preventing breakdown.

As described above, display surfaces of a plurality of display panels having different areas are arranged back to back. Further, electronic components, which are necessary for operation of the display panels or an electronic device into which the display panels are incorporated, are mounted on a back side of the display panel having a larger area (that is, in the periphery of the display panel having a smaller area). Therefore, the display module can be downsized. In addition, since a printed board used conventionally is not used, a thin shape of the display module can be achieved.

Embodiment Mode 3

Figure 5:
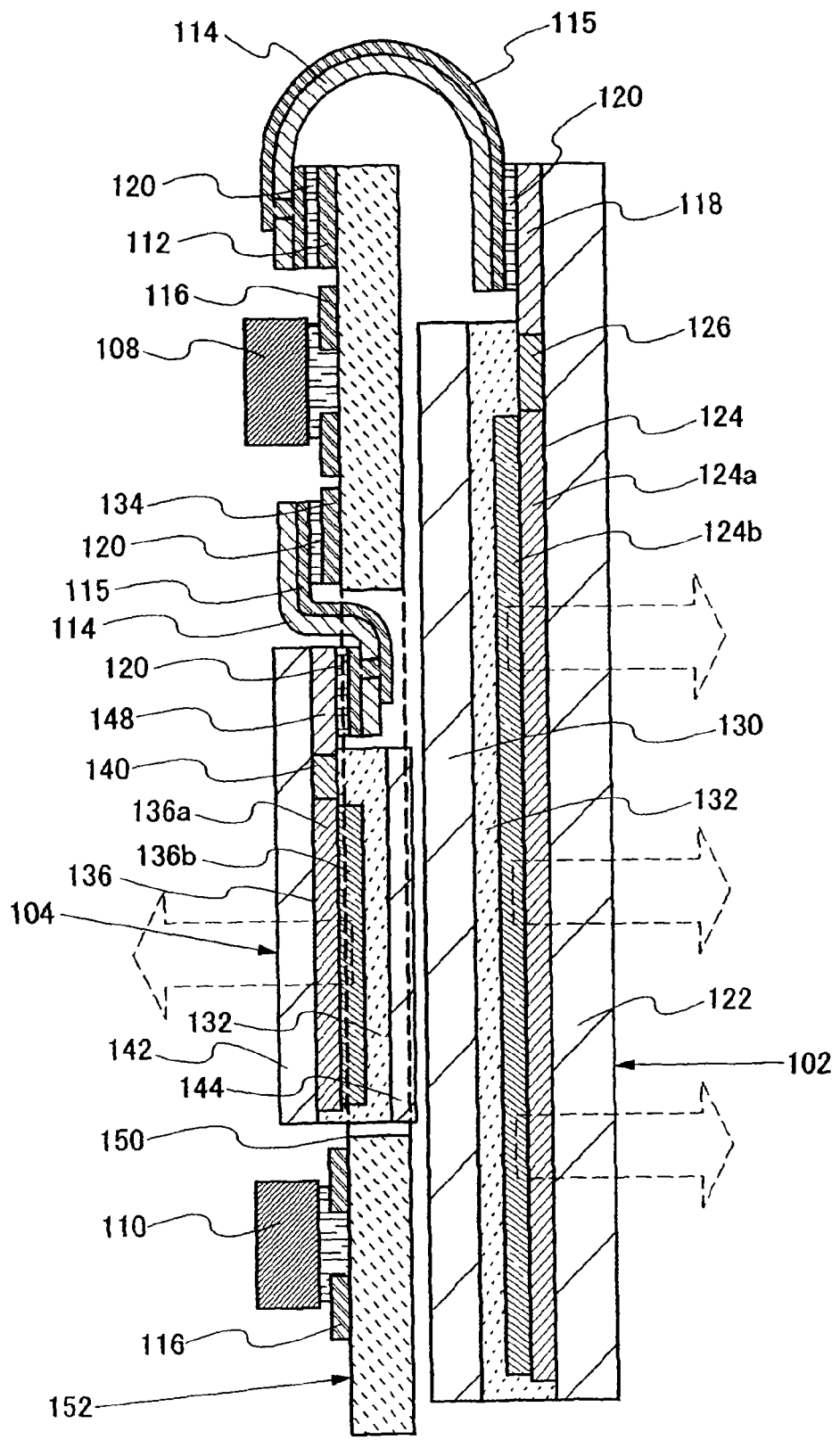
FIG. 5 is a view showing a structure of a display module according to Embodiment Mode 3.
Figure 6:
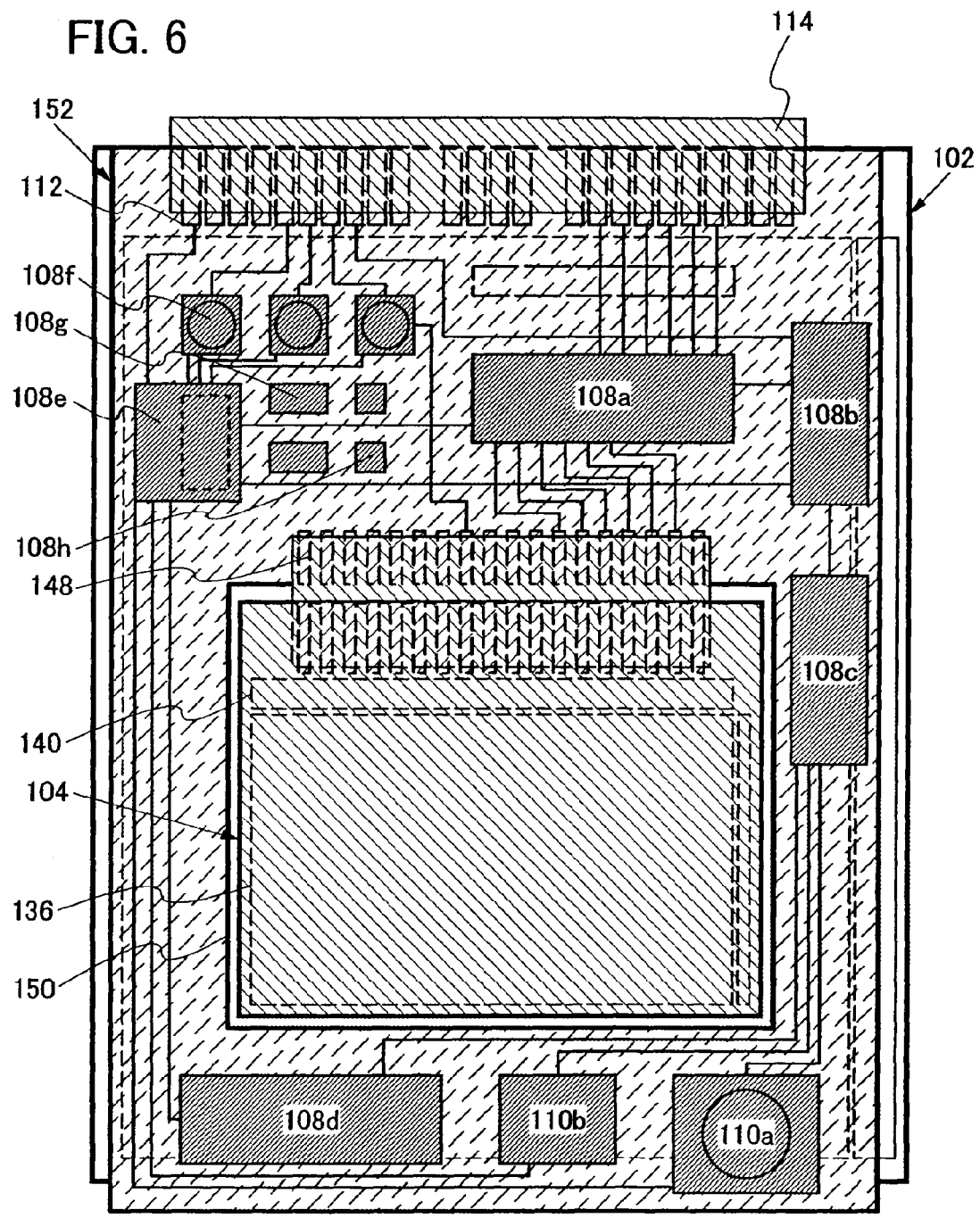
FIG. 6 is a view showing a structure of a display module according to Embodiment Mode 3.

With reference to FIGS. 5 and 6, this embodiment mode will describe a mode of mounting individual components such as an IC chip on a printed wiring board and overlapping the printed wiring board with a display panel forming a main screen in order to achieve downsizing and a thin shape of a display module which includes a plurality of display panels forming a main screen and a sub-screen. FIG. 6 is a top view of the display module from one side and FIG. 5 is a cross-sectional view. Hereinafter, the description will be given with reference to the both drawings.

The display module according to this embodiment mode includes a first display panel 102 and a second display panel 104. The first display panel 102 and the second display panel 104 are provided so that images including characters, graphics, and symbols are displayed in different directions. In addition, the first display panel 102 and the second display panel 104 are different in screen size, and one display panel forms a main screen and the other display panel forms a sub-screen. FIGS. 5 and 6 show a case where the second display panel 104 is smaller than the first display panel 102. In this case, the first display panel 102 forms the main screen and the second display panel 104 forms the sub-screen.

In the first display panel 102, a display portion 124 and a terminal 118 are formed over a first substrate 122. Besides, a scanning line driver circuit 128 and a signal line driver circuit 126 may also be formed. In the second display panel 104, a display portion 136 and a terminal 148 are formed over a second substrate 142. Besides, a scanning line driver circuit 138 and a signal line driver circuit 140 may also be formed.

In the first display panel 102, at least the display portion 124 is covered with a first sealing substrate 130. A sealing material 132 is filled between the first sealing substrate 130 and the display portion 124, and the first sealing substrate 130 is fixed to the first substrate 122. In addition, in the second display panel 104, at least the display portion 136 is covered with a second sealing substrate 144. The sealing material 132 is filled between the second sealing substrate 144 and the display portion 136, and the second sealing substrate 144 is fixed to the second substrate 142. These structures related to the first display panel 102 and the second display panel 104 are the same as those in Embodiment Mode 1.

An IC chip 108 and/or a sensor chip 110 are/is mounted on a printed wiring board 152 which is provided so as to be overlapped with the first display panel 102. The IC chip 108 and the sensor chip 110 are prepared as individual components and mounted so as to form electrical connection with connecting portions of wirings 116 that are appropriately provided. Herein, the components mounted on the printed wiring board 152 are the same as those in Embodiment Mode 1.

A signal or electric power necessary for driving the first display panel 102 is supplied from the printed wiring board 152. The first display panel 102 and the printed wiring board 152 are connected by using a flexible substrate 114 (flexible printed wiring board) provided with a wiring 115, typically. The terminal 118 of the first display panel 102 and a first terminal 112 of the printed wiring board 152 are used for the connection. In addition, in the second display panel 104, the flexible substrate 114 is similarly used and electrical connection with the printed wiring board is formed. The terminal 148 of the second display panel 104 and a second terminal 134 of the printed wiring board 152 are used for the connection. In this case, an opening 150 which hollows out part of the printed wiring board 152 may be provided so that the second display panel 104 arranged in an inner side of the printed wiring board 152 is not projected from the printed wiring board 152. Since the second display panel 104 is provided inside the opening 150, the second display panel 104 can be fixed to a back side of the first display panel 102 (the opposite side of the display surface). When the printed wiring board 152 has a multilayered wiring layer (multilayered printed wiring board), higher-density mounting is possible, and this contributes to downsizing of the display module.

In the first display panel 102, at least the display portion 124 is covered with the first sealing substrate 130. The first sealing substrate 130 is fixed to the first substrate 122 with the sealing material 132. This structure is preferably employed in a case of using an EL element for a display element array 124b. The first substrate 122 has a function of keeping the mechanical strength as a flat display panel in addition to a function of fixing the display portion 124, the scanning line driver circuit 128, the signal line driver circuit 126, and the terminal 118 by organically connecting them. The mechanical strength refers to a thickness which prevents the display module from being easily broken due to an impact or a vibration when the display module is incorporated into a chassis of an electronic device or the like, or the sufficient strength which prevents the display module from being broken in handling of a device in manufacturing. In this case, when the first substrate 122 has a constant thickness to keep the mechanical strength, the first sealing substrate 130 can be thinner than the first substrate 122. In addition, when the first sealing substrate 130 is made to be thin, the strength may be supplemented by combining a reinforcing material such as a resin film.

Similarly, in the second display panel 104, the second sealing substrate 144 is fixed to the second substrate 142 with the sealing material 132. In this case, when the second substrate 142 has a constant thickness to keep the mechanical strength, the second sealing substrate 144 can be thinner than the second substrate 142. In addition, when the second display panel 104 is smaller than the first display panel 102, the second substrate 142 can be thinner than the first substrate 122, and the second sealing substrate 144 can be thinner than the first sealing substrate 130.

When the first sealing substrate 130 of the first display panel 102 and the second sealing substrate 144 of the second display panel 104 are in close contact with each other, the both sealing substrates can be further thinned. Alternatively, the sealing substrate of the second display panel 104 may be omitted, and the first sealing substrate 130 may be used in common in the first display panel 102 and the second display panel 104.

As described above, display surfaces of a plurality of display panels having different areas are arranged back to back. Further, electronic components, which are necessary for operation of the display panels or an electronic device into which the display panels are incorporated, are mounted on a back side of the display panel having a larger area (that is, in the periphery of the display panel having a smaller area). Therefore, the display module can be downsized. In addition, since a printed board used conventionally is not used, a thin shape of the display module can be achieved.

Embodiment Mode 4

Figure 7:
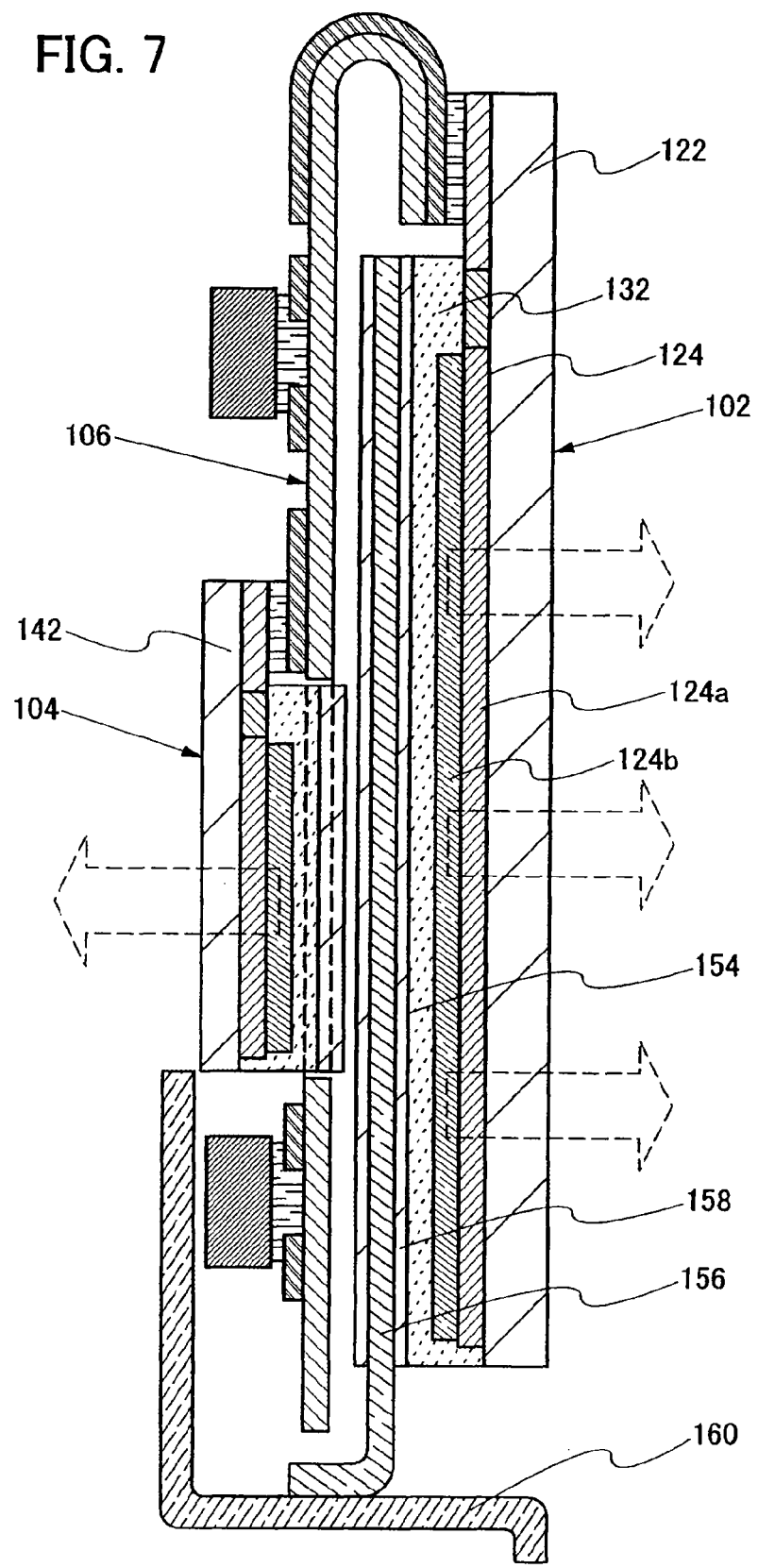
FIG. 7 is a view showing a structure of a display module according to Embodiment Mode 4.

This embodiment mode will describe a structure of the display module shown in Embodiment Mode 1, in which a sealing substrate is different, with reference to FIG. 7.

FIG. 7 shows a display module including a first display panel 102, a second display panel 104, and a signal processing circuit substrate 106. The display module has the same structure as that in Embodiment Mode 1. Hereinafter, different portions from Embodiment Mode 1 will be described.

The first display panel 102 shown in FIG. 7 has a structure in which a temperature increase due to generation of heat in the display panel can be suppressed. A sealing substrate 154 fixed to a first substrate 122 with a sealing material 132 has a thermal conductive layer 156. In addition, a protective layer 158 covering the thermal conductive layer 156 is provided.

As a material for forming the thermal conductive layer 156, a metal material, a ceramic material, or the like can be used. As the metal material, silver, gold, copper, iron, aluminum, or the like can be given, and alloy containing at least one kind of these elements may also be employed. In addition, as the ceramic material, alumina, boron nitride, or the like can be used. Besides, a diamond film may be used. In any case, a material having high thermal conductivity is preferably selected.

The protective layer 158 is preferably provided to cover, insulate, and protect the surface of the thermal conductive layer 156 and to enhance adhesion with the sealing material 132. However, the protective layer 158 is not essential in the structure of this embodiment mode, and may be appropriately omitted. As the protective layer 158, polyimide, acrylic, or the like can be employed as for a resin material. In addition, silicon oxide, silicon nitride, silicon carbide, or the like can be used as for an inorganic material.

In the first display panel 102, a heat source is a signal line or scanning line driver circuit, and further, a driving element array 124a or a display element array 124b. In order to dissipate heat generated in the panel effectively, at least the thermal conductive layer 156 is preferably extended to the outside of the panel to be in contact with part of a main body of an electronic device or a chassis 160 which holds the display module. More effectively, a heat sink provided with a dissipating fin may be provided.

When the temperature in the display panel is increased, operation characteristics of each element forming the driving element array 124a or the display element array 124b are changed, and stable operation of the display module is obstructed; therefore, it is preferable to perform heat dissipation treatment as in this embodiment mode. For example, when operating temperatures of EL elements which are arranged as the display element array 124b are increased, light-emitting efficiency is lowered. Heat sources are not uniform in the panel surface; thus, a temperature is partially high in a portion where a signal line or scanning line driver circuit is arranged in some cases. In such a case, brightness in one display screen may be not uniform. However, when heat dissipation treatment is performed as in this embodiment mode, such variations can be suppressed.

FIG. 7 shows a structure in which the thermal conductive layer 156 is provided over the sealing substrate 154 of the first display panel 102; however, the present invention is not limited to this structure. The sealing substrate of the second display panel 104 may have the same structure, or the first substrate 122 or the second substrate 142 may be provided with a thermal conductive layer. In any case, when a display module in which a thermal conductive layer capable of obtaining heat dissipation effect is provided so as to be in contact with a display panel is formed, operation defects due to self-heating can be suppressed.

It is to be noted that the structure in this embodiment mode can be implemented by combining with the display modules shown in Embodiment Modes 2 and 3.

Embodiment Mode 5

In the display module shown in Embodiment Mode 1, part of the IC chip and/or the sensor chip mounted on the signal processing circuit substrate 106, or other IC chip and/or sensor chip may be mounted on a sealing substrate as in the display module shown in Embodiment Mode 2. By such a structure, the number of chips which can be mounted in the display module can be increased, and downsizing can be achieved. In addition, a much higher functional display module can be achieved.

This embodiment mode can be implemented by combining with Embodiment Mode 4.

Embodiment Mode 6

Figure 8:
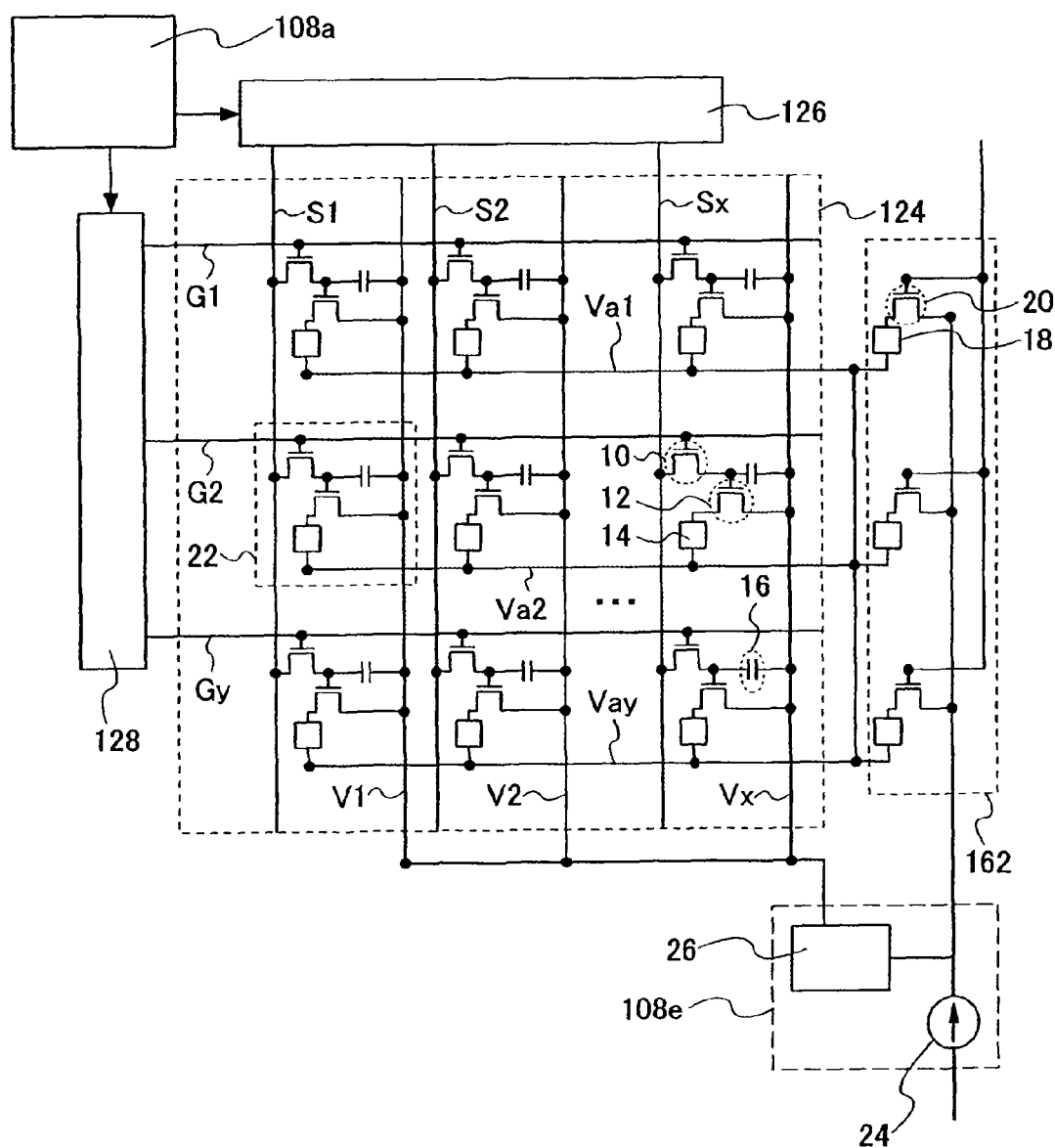
FIG. 8 is a diagram showing a configuration of a display module according to Embodiment Mode 6.
Figure 9:
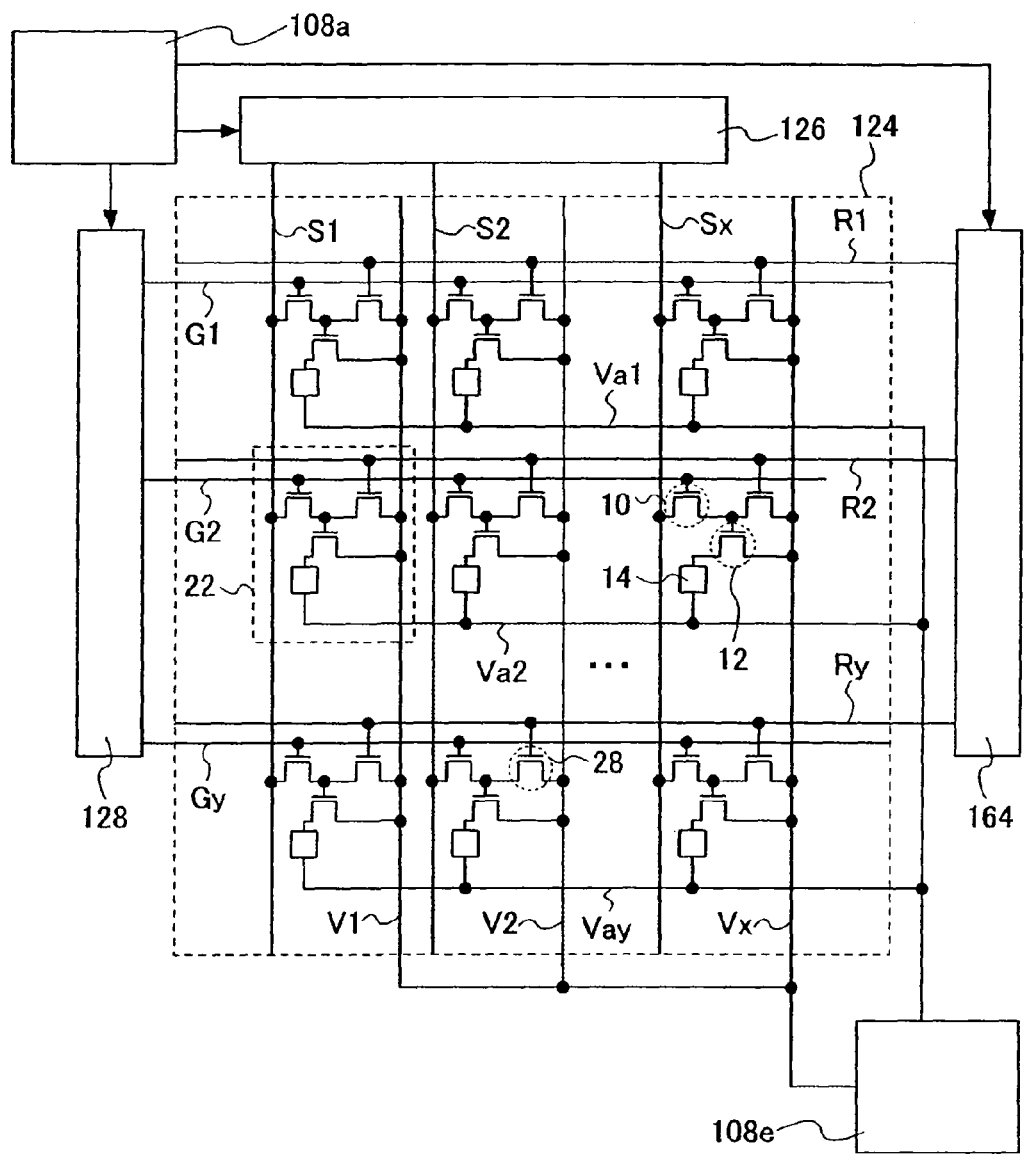
FIG. 9 is a diagram showing a configuration of a display module according to Embodiment Mode 6.
Figure 10:
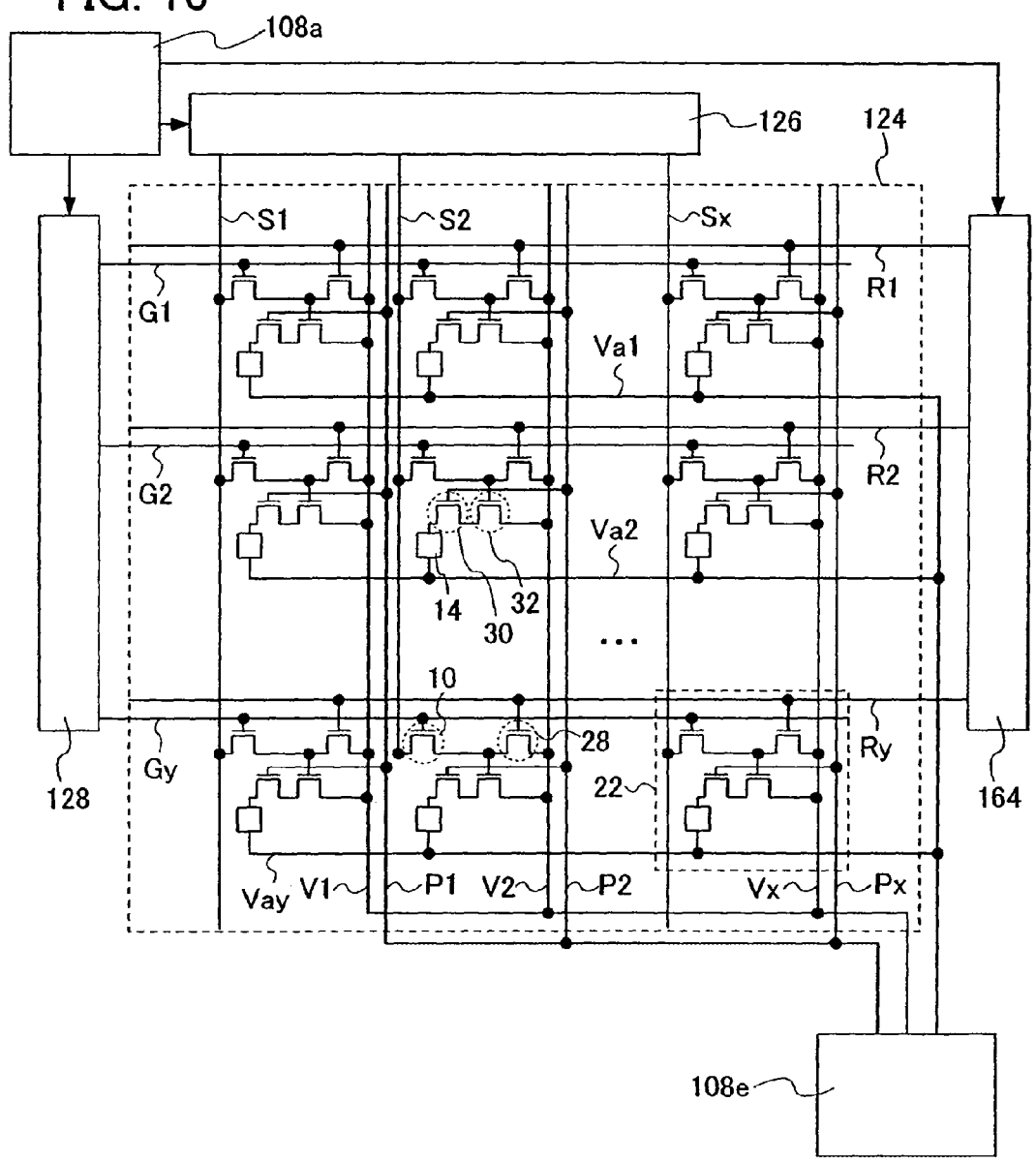
FIG. 10 is a diagram showing a configuration of a display module according to Embodiment Mode 6.

This embodiment mode will describe a configuration which can be applied to the display portion of the first display panel and/or the second display panel in the display modules shown in Embodiment Modes 1 to 5 with reference to FIGS. 8, 9, and 10.

FIG. 8 shows a configuration of a display penal provided with a display portion 124, and in the periphery thereof, a scanning line driver circuit 128 and a signal line driver circuit 126. In the display portion 124, source lines S1 to Sx, gate lines G1 to Gx, power supply lines V1 to Vx, and common potential lines Va1 to Vay (x and y are natural numbers) are formed. In addition, in the display portion 124, a plurality of pixels 22 is arranged. Each of the pixels 22 is roughly divided by the wirings as described above and includes a light emitting element 14 and two transistors, i.e. a first transistor 10 and a second transistor 12.

The scanning line driver circuit 128 and the signal line driver circuit 126 receive various signals for displaying an image from a controller 108a. A power supply circuit 108e supplies power supply potential to the pixels 22 through the power supply lines V1 to Vx. In the case of FIG. 8, the power supply circuit 108e includes a current source 24 and a voltage generating circuit 26.

The signal line driver circuit 126 supplies a video signal to each of the pixels 22 through the source lines S1 to Sx. The scanning line driver circuit 128 supplies a gate selection signal to each of the pixels 22 through the gate lines G1 to Gy. The pixel 22 includes the first transistor 10 which controls input of a video signal supplied from each of the source lines S1 to Sx and the second transistor 12 which controls a current flowing into the light emitting element 14. In addition, the pixel 22 includes a capacitor element 16 which holds a voltage between a gate and a source of the second transistor 12.

Further, in FIG. 8, a monitor element array 162 provided with a monitor element 18 having the same structure as that of the light emitting element 14 of the pixel 22 and a fourth transistor 20 which controls a current flowing into the monitor element 18 is provided so as to be adjacent to the display portion 124. The monitor element 18 is connected to the current source 24 through the fourth transistor 20. When the fourth transistor 20 is turned on and a current is supplied from the current source 24, the monitor element 18 emits light. At this time, potential of a terminal that is not provided on the common potential lines Va1 to Vay side is applied to the voltage generating circuit 26, and a current corresponding to the voltage is applied to each light emitting element 14 of the display portion 124. As the voltage generating circuit 26, a voltage follower or the like can be employed. When luminance of the light emitting element is changed over time or the temperature is changed, such a configuration functions effectively to apply dynamic correction.

FIG. 9 shows a configuration in which a light emitting element 14 and three transistors of a first transistor 10, a second transistor 12, and a third transistor 28 are provided in one pixel 22. In this configuration, the capacitor element 16 in the configuration of FIG. 8 is deleted, and gate lines R1 to Ry, the third transistor 28 used for erasing, and a scanning line driver circuit 164 which controls a gate signal of the third transistor 28 are provided. The scanning line driver circuit 164 is also controlled by a controller 108a.

The third transistor 28 controls an on state and an off state of the second transistor 12. Light emission of the light emitting element 14 depends on the on state and the off state of the second transistor 12; therefore, it is possible to forcibly make a state where a current does not flow into the light emitting element 14 by an arrangement of the transistor 28 for erasing. Thus, a lighting period can be started at the same time or right after the start of a writing period without waiting for writing of signals to all the pixels. Accordingly, a period where the light emitting element 14 emits light can be actively controlled and a moving image can be preferably displayed compared with the configuration of FIG. 8.

FIG. 10 shows a configuration in which a light emitting element 14, a first transistor 10, a fifth transistor 30, and a sixth transistor 32 are provided in one pixel 22. In this configuration, the second transistor 12 in FIG. 9 is deleted, and power supply lines P1 to Px, the fifth transistor 30 for driving, and the sixth transistor 32 for current control are additionally provided.

A power supply circuit 108e supplies power supply potential to the pixels 22 through the power supply lines P1 to Px. A gate electrode of the fifth transistor 30 is connected to a power supply line Pm (1≤m≤x, m is a natural number) held at constant potential so that potential of the gate electrode is fixed and the fifth transistor 30 is operated in a saturation region. In addition, through the first transistor 10, a video signal which transmits information about lighting or non lighting of the light emitting element 14 is inputted into a gate electrode of the sixth transistor 32 for current control, which is connected to the fifth transistor 30 in series and operated in a linear region. Since a voltage between a source and a drain of the sixth transistor 32 for current control, which is operated in a linear region, is low, a slight variation in voltage between a gate and a source of the sixth transistor 32 for current control does not influence the value of a current which flows into the light emitting element 14. Therefore, the value of the current which flows into the light emitting element 14 is determined by the fifth transistor 30 for driving, which is operated in a saturation region. It is to be noted that, in this configuration, a gate capacitance of the fifth transistor 30 for driving is used as a capacitance for holding the voltage between a gate and a source of the fifth transistor 30 for driving; therefore, a capacitor element is not clearly shown. However, a capacitor element is clearly provided as needed.

As shown in FIGS. 8, 9, and 10, various dot configurations can be applied to the display module according to the present invention. In addition, although not illustrated in this embodiment mode, a dot circuit which controls flashing of a light emitting element in a pixel by using a current signal can also be employed, similarly.

Embodiment Mode 7

Figure 11:
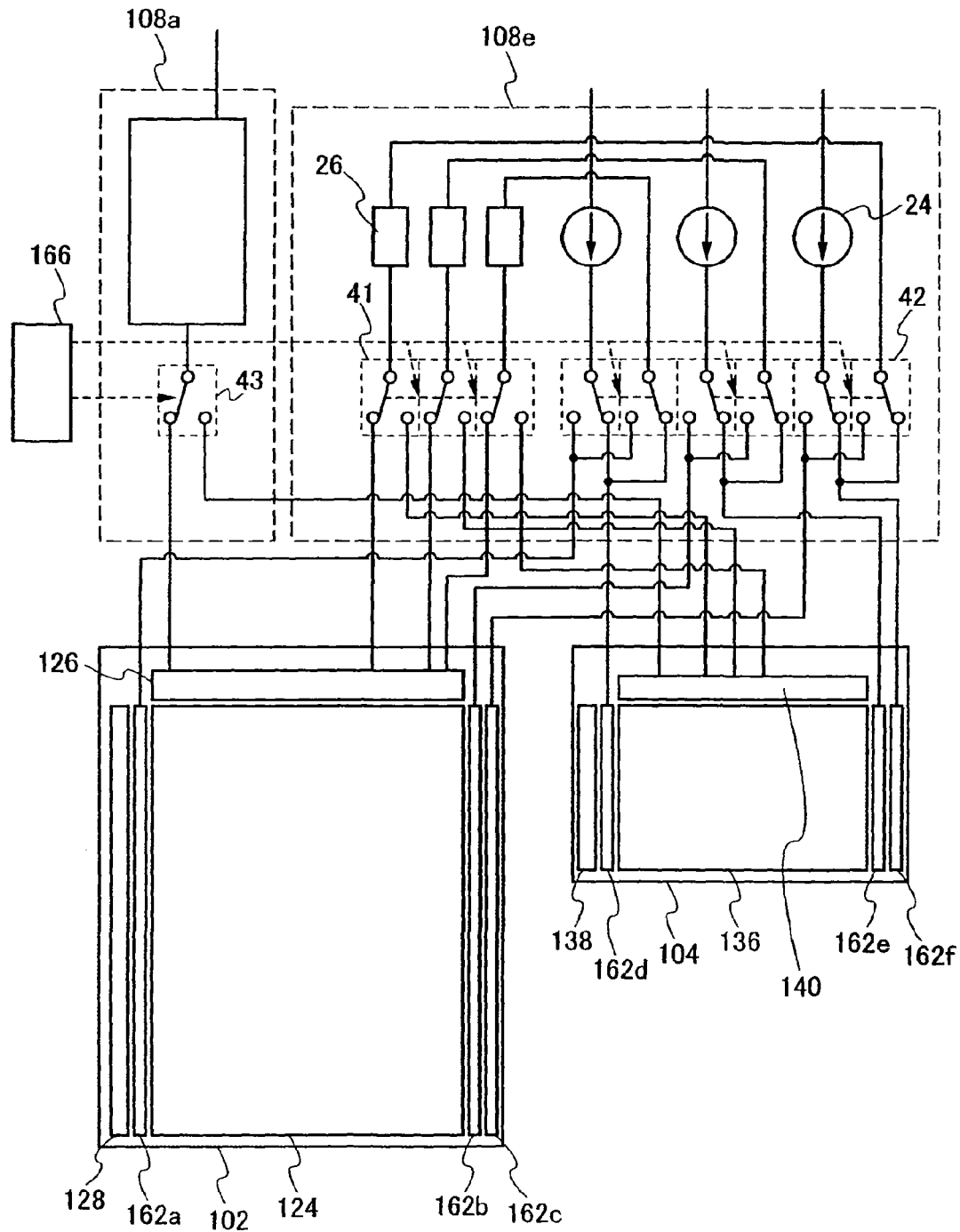
FIG. 11 is a diagram showing a configuration of a display module according to Embodiment Mode 7.

With reference to FIG. 11, this embodiment mode will describe one mode of a display module in which a first display panel and a second display panel are each provided with the display panel configuration that is described in Embodiment Mode 6 with reference to FIG. 8. In addition, FIG. 8 is also used as needed.

FIG. 11 shows a relation of a first display panel 102, a second display panel 104, a controller 108a, and a power supply circuit 108e. Herein, the first display panel 102 is a main display panel and the second display panel 104 is a sub-display panel.

The first display panel 102 includes a first monitor element array 162a, a second monitor element array 162b, and a third monitor element array 162c in addition to a display portion 124, a scanning line driver circuit 128, and a signal line driver circuit 126. As described in FIG. 8, a pixel 22 in the display portion 124 includes a light emitting element 14. When plural kinds of tight emitting elements emitting different colors are provided, monitor element arrays are also arranged in a similar manner. Typically, when color display is performed in an RGB mode, pixels corresponding to three colors are prepared, and a dot including the pixels as a set is formed. At this time, monitor element arrays corresponding to three colors are also prepared. FIG. 11 shows such a case. Obviously, when the pixel is formed using a white light emitting element, a monitor element array corresponding to a white color may be arranged.

Similarly, the second display panel 104 includes a fourth monitor element array 162d, a fifth monitor element array 162e, and a sixth monitor element array 162f in addition to a display portion 136, a scanning line driver circuit 138, and a signal line driver circuit 140.

The controller 108a, which supplies a video signal to the first display panel 102 and the second display panel 104, includes a switch 43. The switch 43 selects either the first display panel 102 or the second display panel 104 to supply a video signal. In this manner, by providing the switch which switches targets for sending a video signal, the controller can be used in common and the number of components in the display module can be reduced. Operation of the switch 43 is controlled by, for example, a signal of a switch 166. The switch 166 is, for example, a switch which detects an open/close state of a two-screen cellular phone provided with display panels on both sides of a chassis that can be opened or closed.

Here, the light emitting element provided in the display portion and the monitor element provided in the monitor element array are operated under different driving conditions and the driving conditions are controlled so that the ratio of the total amounts of electric charges flowing into the light emitting element provided in the display portion and the monitor element fulfills a constant relation in consideration of luminance deterioration. Accordingly, luminance deterioration and a temperature change in the display portion can be suppressed. Specifically, the driving condition of the monitor element may be set to be overload compared with the driving condition of the light emitting element in the display portion. The light emitting element in the display portion has a light emission period and a non light emission period in one frame period in accordance with a video signal, whereas the monitor element is driven by a constant current. In this manner, the both elements are driven so that the driving condition of the monitor element is set to be overload compared with the driving condition of the light emitting element in the display portion, and the driving conditions are controlled to keep luminance of the light emitting element for display constant, and thus, luminance of the light emitting element for display can be corrected to be constant.

When the monitor element in the vicinity of the display portion is lighted, there is a problem that unnecessary light leaks and visibility of the display screen is lowered. In order to solve such a problem, in FIG. 11, switches 41 and switches 42 are provided in the power supply circuit 108e so that the monitor elements are switched when the switch 43 of the controller 108a selects either the first display panel 102 or the second display panel 104 as a target for supplying a video signal. In other words, as shown in FIG. 17, when a video signal is supplied to the first display panel 102, current sources 24 and voltage generating circuits 26 are switched so that the fourth monitor element array 162d, the fifth monitor element array 162e, and the sixth monitor element array 162f of the second display panel 104 are operated. On the contrary, when a video signal is supplied to the second display panel 104, the current sources 24 and the voltage generating circuits 26 are switched so that the first monitor element array 162a, the second monitor element array 162b, and the third monitor element array 162c of the first display panel 102 are operated. Operation of the switches 43, 41, and 42 is performed based on a switching signal from the switch 166.

In a two-screen cellular phone provided with display panels on both sides of a chassis that can be opened or closed or the like, both screens are not seen at the same time. Therefore, a problem of light leakage can be solved when light emission of the monitor element is switched from a front side to a back side. Obviously, a light shielding film may be provided in the monitor element. By employing a configuration of this embodiment mode, an area of the light shielding film can be minimized and an area of a peripheral region (frame region) of the display portion can be reduced.

Embodiment Mode 8

Figure 12:
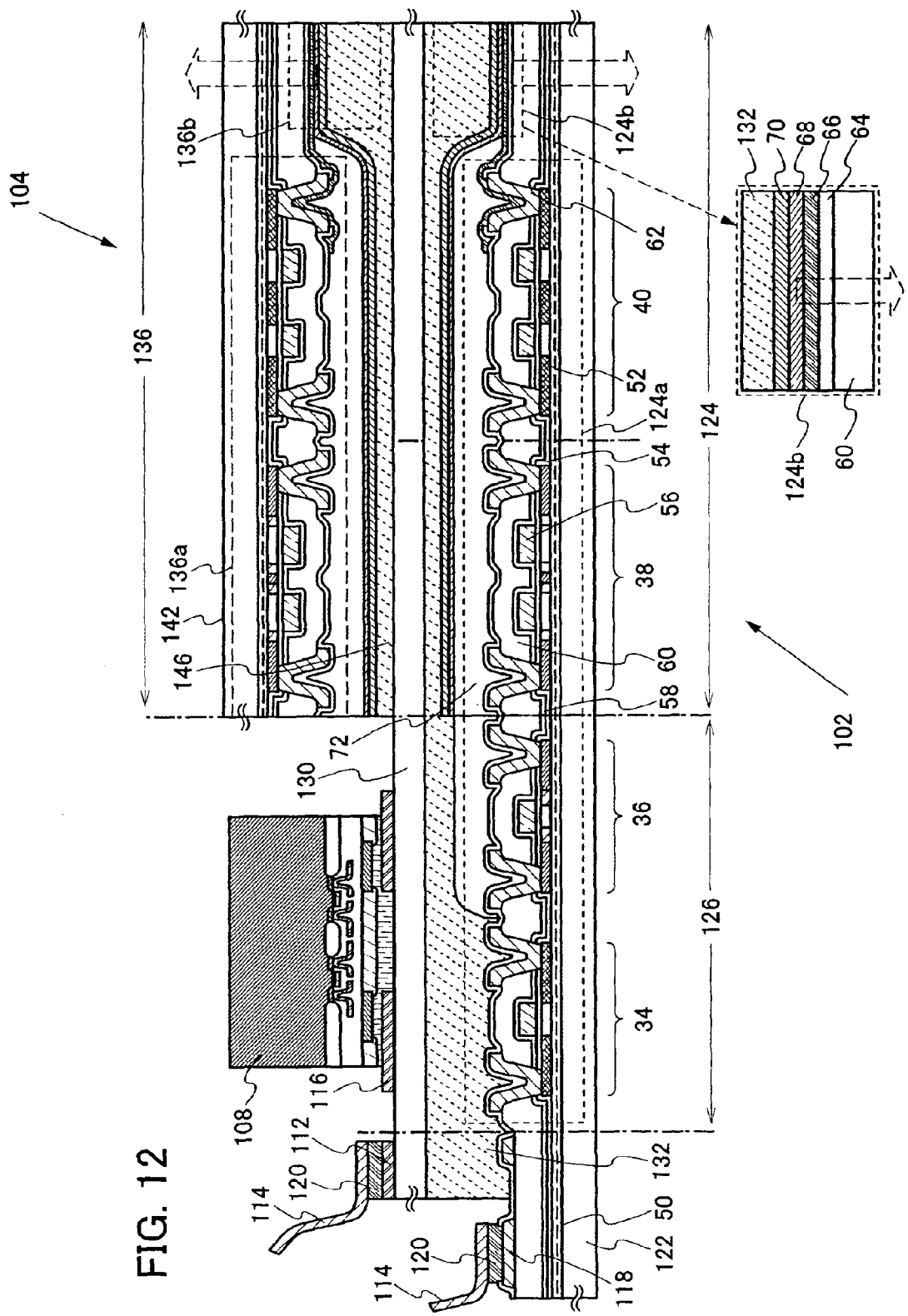
FIG. 12 is a view showing a structure of a display module according to Embodiment Mode 8.

This embodiment mode will describe details of a display module which includes a plurality of display panels forming a main screen and a sub-screen with reference to FIG. 12. It is to be noted that FIG. 12 shows a display module in which individual components such as an IC chip are mounted on a substrate used as a sealing material as shown in Embodiment Mode 2.

FIG. 12 shows a structure in which a first display panel 102 and a second display panel 104 use a sealing substrate 130 in common and are fixed with a sealing material 132 so that display screens are formed on opposite sides.

The first display panel 102 includes a terminal 118 connected to a flexible substrate 114 provided with a wiring, a signal line driver circuit 126, and a display portion 124. The signal line driver circuit 126 includes a p-channel transistor 34 and an n-channel transistor 36. In addition, a shift register circuit, a latch circuit, a level shifter circuit, a switching circuit, and the like are formed. A scanning line driver circuit also includes a p-channel transistor and an n-channel transistor.

The display portion 124 includes a driving element array 124a and a display element array 124b. The driving element array 124a includes a first transistor 38 for switching and a second transistor 40 for driving. These transistors are each formed by using a semiconductor layer 52, a gate insulating layer 54, and a gate electrode layer 56 over a base insulating film 50 formed over a first substrate 122. The transistor can have a single drain structure in which a channel forming region is provided between a pair of a source and a drain, an LDD structure in which a low-concentration drain (LDD) is provided between a channel forming region and a drain, a gate overlap drain structure in which an LDD is overlapped with a gate electrode, or the like, appropriately. The transistor in the display portion 124 may also have a multi-gate structure in which a plurality of gate electrodes is interposed (a plurality of channel forming regions is arranged in series) between a pair of a source and a drain. In addition, single crystal silicon, polycrystal silicon, or amorphous silicon can be used for the semiconductor layer 52. FIG. 12 shows a top gate transistor in which the gate electrode layer 56 is formed after forming the semiconductor layer 52. However, a bottom gate transistor in which the semiconductor layer is formed after forming the gate electrode may also be employed. In particular, the latter case is desirable in a case of using amorphous silicon.

Over the gate electrode layer 56, a passivation layer 58 and an interlayer insulating layer 60 are formed. In addition, a wiring 62 is formed thereover. In FIG. 12, an EL element is used for the display element array 124b and is arranged above the interlayer insulating layer 60. A partition layer 72 is formed over the wiring 62. An opening is formed in a region of the partition layer 72, where the EL element is formed. The EL element is formed by stacking a first electrode 66, an EL layer 68, and a second electrode 70. The EL layer 68 at least includes a substance which exhibits electroluminescence and is formed by appropriately combining layers having different carrier transporting properties, which are also referred to as a hole injecting transporting layer, a light emitting layer, and an electron injecting transporting layer. The first electrode 66 of the EL element extends over the interlayer insulating layer 60 and is connected to the wiring 62; thus, electrical connection of the display element array 124b and the driving element array 124a is formed. This connection is formed in each pixel. As shown in FIG. 12, when light from the EL layer 68 is emitted to the first electrode 66 side, the first electrode 66 is formed of a transparent conductive film and the second electrode is formed of a metal electrode.

It is to be noted that, in FIG. 12, a second interlayer insulating layer 64 is provided between the first electrode 66 of the EL element and the interlayer insulating layer 60. When the wiring is formed by etching over the interlayer insulating layer 60, an etching residue may be left and a progressive defect of the EL element (a defect that is deterioration over time where a non light emitting region is grown) may be caused; however, the second interlayer insulating layer 64 effectively functions to prevent the defect. Accordingly, the second interlayer insulating layer 64 can also be omitted.

A driving element array 136a and a display element array 136b in a display portion 136 of the second display panel 104 also have the same structure as that of the display portion 124 of the first display panel 102.

As described in Embodiment Mode 2, the first display panel 102 and the second display panel 104 are different in screen size, and one display panel forms a main screen and the other display panel forms a sub-screen. As illustrated in FIG. 12, over the first sealing substrate 130, a wiring 116 is formed and an IC chip 108 is mounted in a region where the second display panel 104 is not provided. The IC chip 108 is mounted by face down bonding; however, wire bonding can also be employed. The IC chip 108 is preferably mounted with a bare chip, and in this case, a thickness of the chip can be thin; therefore, the IC chip 108 is as high as the second substrate 142. In this manner, a surface on the opposite side of a display surface of the first display panel 102 is effectively utilized; thus, the display module can be formed to be compact.

It is to be noted that the structure of the display module in this embodiment mode can be applied to the display modules shown in Embodiment Modes 1 to 7.

Embodiment Mode 9

Figure 13:
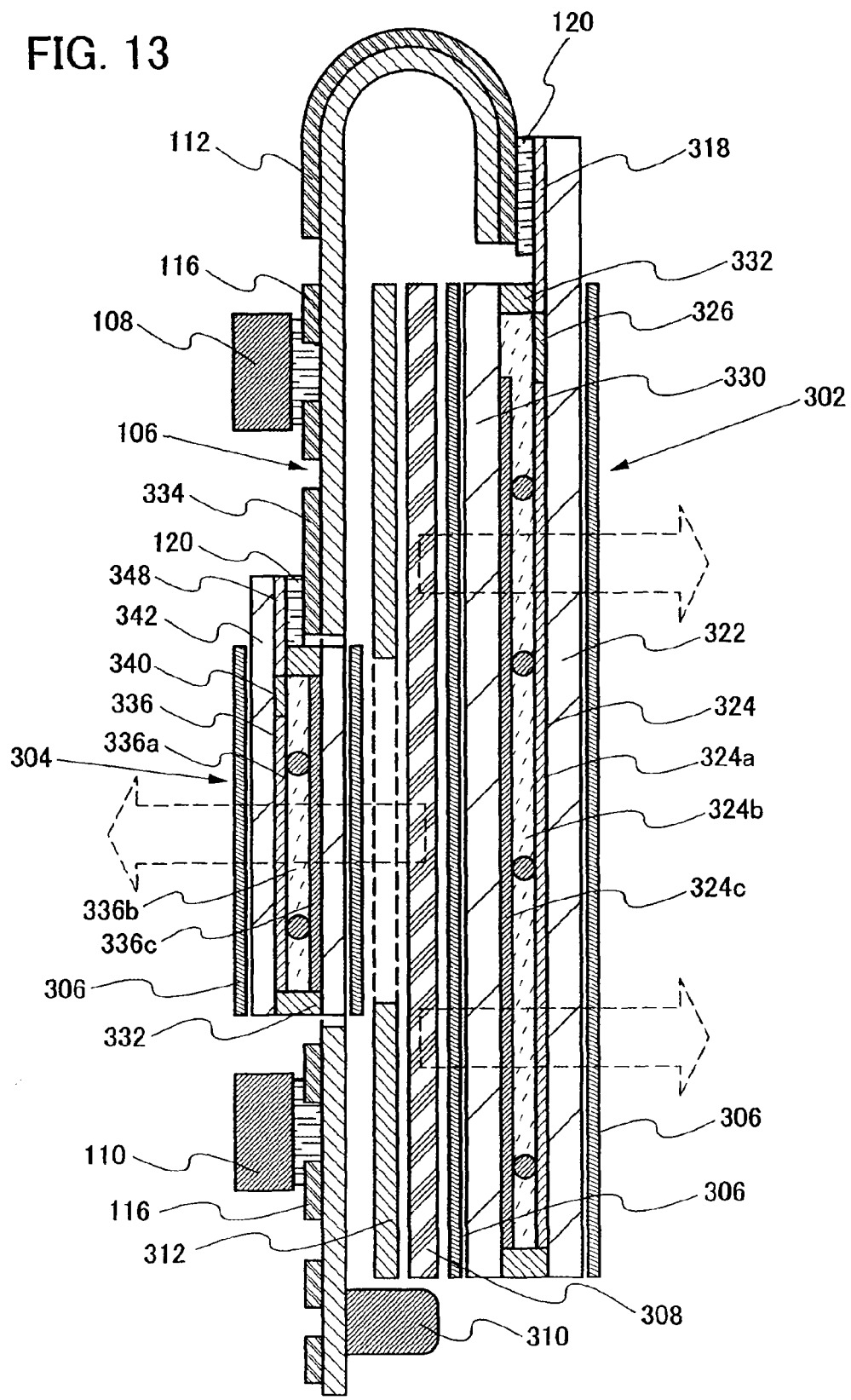
FIG. 13 is a view showing a structure of a display module according to Embodiment Mode 9.

With reference to FIG. 13, this embodiment mode will describe a mode of mounting individual components such as an IC chip on a signal processing circuit substrate in order to achieve downsizing and a thin shape of a display module which includes a plurality of liquid crystal display panels forming a main screen and a sub-screen.

The display module according to this embodiment mode includes a first display panel 302, a second display panel 304, and a signal processing circuit substrate 106 including a controller of the both display panels. The first display panel 302 and the second display panel 304 are provided so that images including characters, graphics, and symbols are displayed on different sides. In addition, the first display panel 302 and the second display panel 304 are different in screen size, and one display panel forms a main screen and the other display panel forms a sub-screen.

External dimensions of the first display panel 302 and the second display panel 304 are made to be different from each other, and, as compared with one display panel, the external dimension (i.e. a panel area) of the other display panel is made to be smaller. Typically, the second display panel 304 forming the sub-screen is made to be smaller than the first display panel 302 forming the main screen. In order to form a compact display module, the first display panel 302 and the second display panel 304 are provided back to back, and a backlight unit 308 is interposed between the both panels. The backlight unit 308 is formed by combining a diffusion plate, a lens sheet, or the like with a light guiding plate so that light from a light source 310 is emitted to both sides. In this case, the backlight unit 308 may also be provided for each of the first display panel 302 and the second display panel 304.

The signal processing circuit substrate 106 is connected to a terminal 318 of the first display panel 302 through a conductive member 120 by using a first terminal 112. The signal processing circuit substrate 106 has a surface where wirings 116 are extended from connecting portions thereof and an IC chip 108 and/or a sensor chip 110 are/is mounted. The mounted surface is arranged so as to be overlapped with the first display panel 302. In this case, a second terminal 334 which forms electrical connection with a terminal 348 of the second display panel 304 is arranged above the first display panel 302. In this manner, a surface on the opposite side of a display surface of the first display panel 302 is effectively utilized; thus, the display module can be formed to be compact.

In this manner, in order to form the mounted surface successively from the first terminal 112 which forms electrical connection with the terminal 318 of the first display panel 302, the signal processing circuit substrate 106 is preferably formed by using a flexible substrate 114 which forms an insulating surface. As in Embodiment Mode 3, a printed wiring board may also be used as a matter of course. As the IC chip 108 and/or the sensor chip 110 which are/is mounted, the same components as those in Embodiment Mode 1 are employed.

In the first display panel 302, a display portion 324 and the terminal 318 are formed over a first substrate 322. Besides, a scanning line and/or signal line driver circuits 326 may also be formed. Obviously, part or all of these driver circuits may be mounted on the signal processing circuit substrate 106 as an IC chip as described above. In the display portion 324, a plurality of pixels is arranged two-dimensionally in an X direction and a Y direction. The display portion 324 includes a driving element array 324a, a display element array 324b, and a color filter array 324c as components.

The driving element array 324a includes a switching element which controls ON and OFF of a signal, and a non-linear element which controls a current flow may also be combined as needed. As a typical switching element, a transistor is usually used. A transistor can have a single-drain structure in which a channel forming region is provided between a pair of a source and a drain, an LDD structure in which a low-concentration drain (LDD) is provided between a channel forming region and a drain, or the like. A transistor may also have a multi-gate structure in which a plurality of gate electrodes is interposed (a plurality of channel forming regions is arranged in series) between a pair of a source and a drain. In addition, single crystal silicon, polycrystal silicon, or amorphous silicon can be used for a semiconductor layer included in a transistor. As a structure of a transistor, a top-gate type in which a gate electrode is formed after forming a semiconductor layer may be employed as well as a bottom-gate type in which a semiconductor layer is formed after forming a gate electrode. In particular, the latter case is desirable in a case of using amorphous silicon.

As for the driving element array 324a, a MIM element may also be used in addition to a transistor. In a case where the display portion 324 is a simple matrix type, the driving element array 324a can be omitted.

The display element array 324b includes a liquid crystal element in which optic characteristics are changed by electric action. The liquid crystal element is formed of a liquid crystal material that is filled between a pair of electrodes. The liquid crystal material is interposed between the first substrate 322 and a first opposite substrate 330, and sealed with a sealing material 332. The liquid crystal element that is interposed between an opposed electrode and a pixel electrode is supplied with a voltage that is a potential difference between the both electrodes, and a polarization state of light which is transmitted through the liquid crystal is changed in accordance with the voltage. In other words, when light of the backlight unit 308 is transmitted through the liquid crystal and polarizing plates 306, light and darkness in accordance with the polarization state of light are displayed. By additionally combining the color filter array 324c, color display can be performed. As the liquid crystal material, a TN liquid crystal is typically used. In this manner, a liquid crystal panel is completed. In this case, by changing a structure of a pixel electrode, the display element array 324b which can operate in a MVA mode or an IPS mode can be employed.

A driver circuit 340, a driving element array 336a, a display element array 336b, and a color filter array 336c of a display portion 336 over a second substrate 342 in the second display panel 304 can be formed by using the same components as those in the first display panel 302. In order to reduce the number of chips mounted on the signal processing circuit substrate 106, it is preferable to use chip components in common in the first display panel 302 and the second display panel 304. In such a case, it is preferable to use the same kind of arrays or the like as in the case of forming the display element arrays both with EL elements.

In this case, the first display panel 302 and the second display panel 304 can be made to be different in screen size and number of dots. For example, in a usage as a cellular phone, the first display panel 302 can be a 2.1-inch type having the number of dots of 320×240 as a QVGA (the number of pixels of 320×240×3 (RGB)), and the second display panel 304 can be a 0.9-inch type having the number of dots of 88×64. In addition, in a usage as a computer provided with an open/close type display screen such as a notebook computer, the first display panel 302 can be a 15-inch type having the number of dots of 1024×768 as an XGA (the number of pixels of 1024×768×3 (RGB)), and the second display panel 304 can be a 3-inch type having the number of dots of 320×240 as a QVGA. Besides, the screen sizes and the number of dots of the first display panel 302 and the second display panel 304 can be appropriately combined to be applied to various electronic devices.

The light source 310 of the backlight unit 308 can also be incorporated into the signal processing circuit substrate 106. As the light source 310, a cold-cathode tube or an electroluminescence (EL) light source can be used in addition to a light-emitting diode (LED). In addition, a light shielding plate 312 is provided between the backlight unit 308 and the second display panel 304 and the signal processing circuit substrate 106. In this structure, light of the backlight unit 308 is prevented from leaking to the second display panel 304 side having a smaller area compared with the first display panel 302. An opening is formed in the light shielding plate 312 so that light from the backlight unit 308 reaches the display screen of the second display panel 304.

As described above, display surfaces of a plurality of liquid crystal display panels having different areas are arranged back to back. Further, electronic components, which are necessary for operation of the liquid crystal display panels or an electronic device into which the liquid crystal display panels are incorporated, are mounted on a back side of the liquid crystal display panel having a larger area (that is, in the periphery of the liquid crystal display panel having a smaller area). Therefore, the display module can be downsized.

In this embodiment mode, the case of using the liquid crystal display panel is described. However, a field emission display (FED) or an SED flat panel display (SED: Surface-conduction Electron-emitter Display) using an electron emitting element, or a display using a contrast medium (electron ink) can also be used.

Embodiment Mode 10

This embodiment mode will describe one example of a cellular phone using any one of the display modules shown in Embodiment Modes 1 to 9 with reference to FIGS. 14A to 14C, 15, and 16.

Figure 14A:
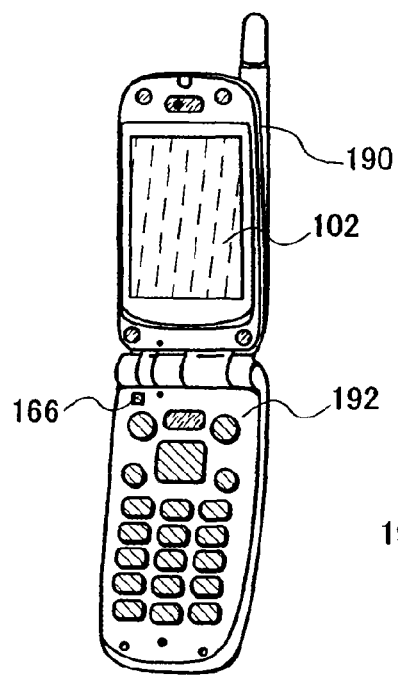
FIGS. 14A to 14C are views each showing a structure of a cellular phone according to Embodiment Mode 10.
Figure 14B:
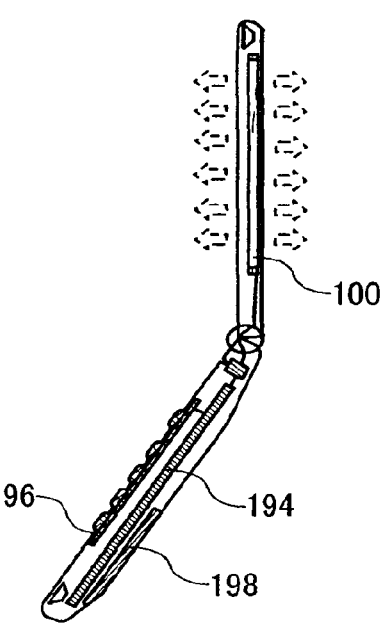
Figure 14C:
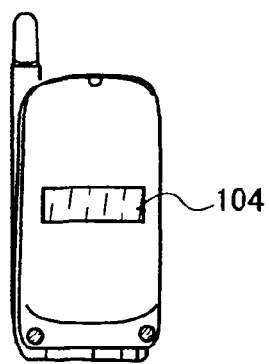
Figure 15:
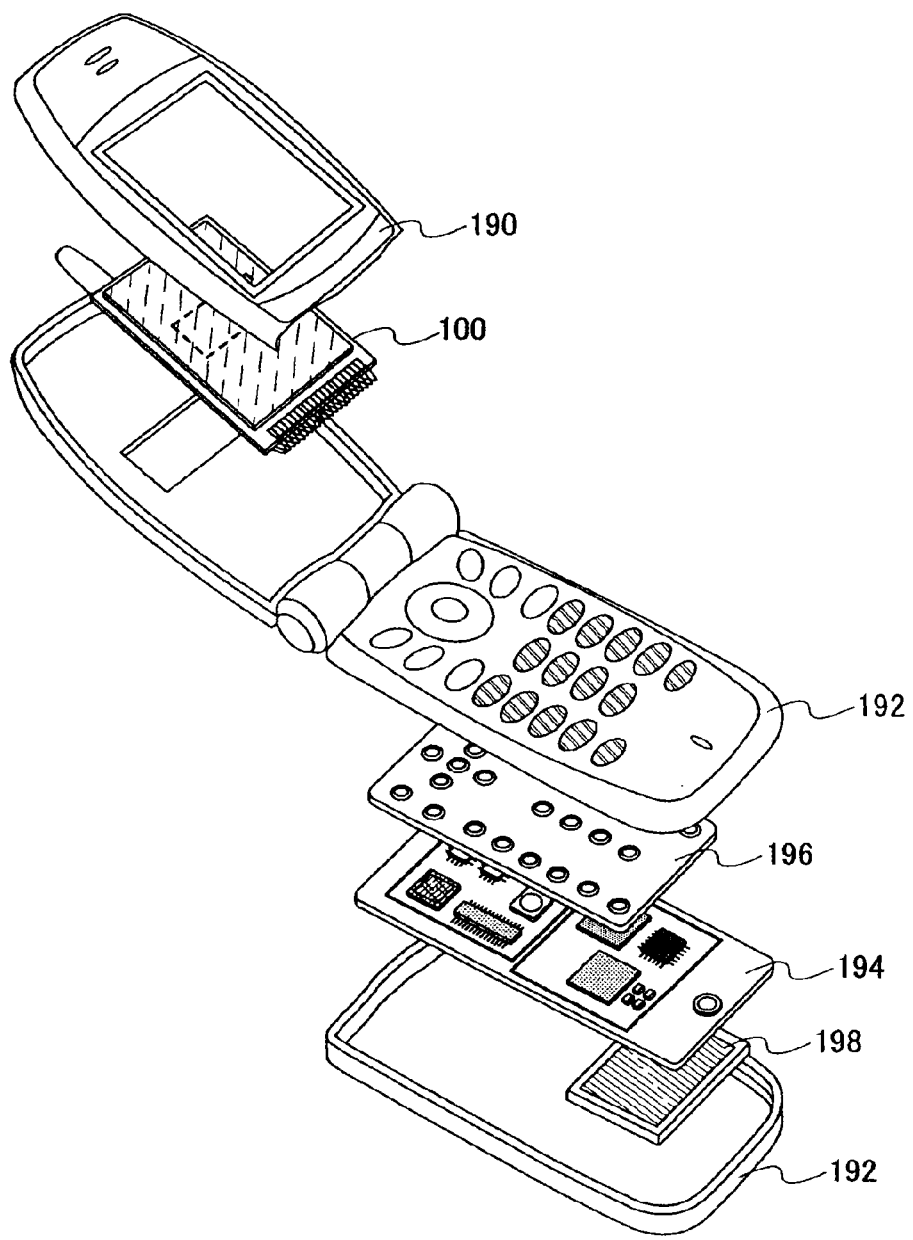
FIG. 15 is a view showing a structure of a cellular phone according to Embodiment Mode 10.

FIGS. 14A to 14C each show an external shape of a cellular phone having a main screen and a sub-screen. In addition, FIG. 15 shows an assembly view of the same cellular phone. In the cellular phone, a display module 100, a key input switch 196, a circuit substrate 194, a secondary battery 198, and the like are stored in a chassis 192. The display module 100 includes two display panels, i.e. a first display panel 102 forming the main display screen and a second display panel 104 forming the sub-display screen. As shown in FIG. 15, a shape corresponding to a display portion of the display module 100 is cut out in a chassis 190 for storing the display module 100. Further, in the display module 100, in addition to the display panel forming the main screen and the display panel forming the sub-screen, an IC chip or a sensor chip is mounted on a back side of the display panel forming the main screen. Therefore, downsizing and a thin shape can be achieved, and the width of the cellular phone can be narrowed as shown in FIG. 14A and a thin shape can be achieved as shown in FIG. 14B.

By a switch 166, the first display panel 102 forming the main display screen operates when the chassises are opened (FIG. 14A), and the second display panel 104 forming the sub-display screen operates when the chassises are folded (FIG. 14C). The switch 166 may be a switch which converts mechanical displacement into an electric signal or a switch which optically detects that the chassises are opened or closed using a photo-sensor or the like and outputs an electric signal.

Figure 16:
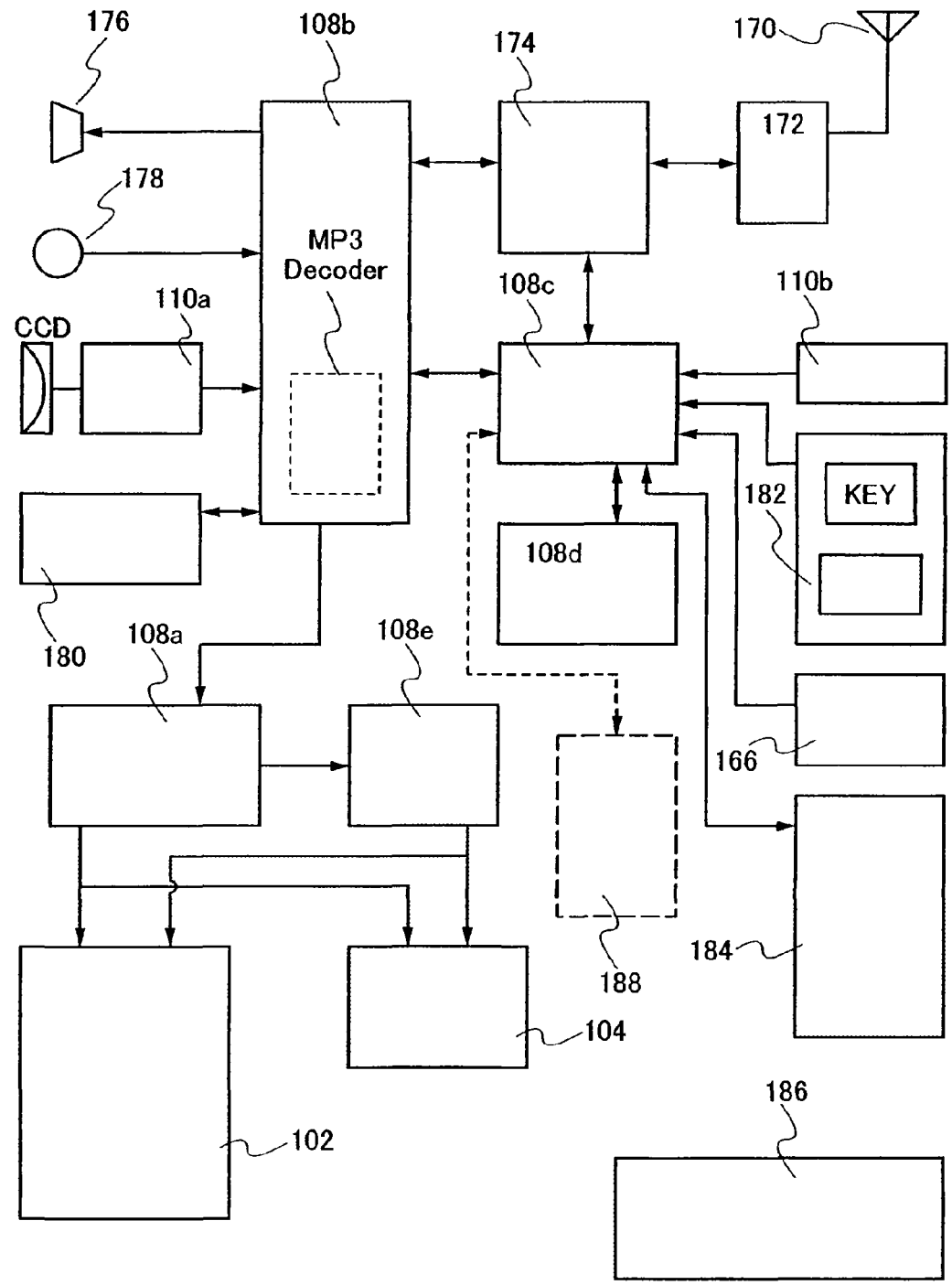
FIG. 16 is a diagram showing a configuration of a cellular phone according to Embodiment Mode 10.

FIG. 16 shows one system configuration example of such a cellular phone. An antenna 170, a radio-frequency circuit 172, a base band processor 174, and the like include a communication circuit or a modulation/demodulation circuit to perform wireless communication at 700 to 900 MHz band or 1.7 to 2.5 GHz band. A sound/image processor 108b communicates with a CPU 108c and sends a video signal to a controller 108a, and in addition, controls a power supply circuit 108e, performs output of sound to a speaker 176, receives input of sound from a microphone 178, processes image data sent from a CCD module 110a, and the like. The image data can also be recorded in a memory card through an auxiliary storage input interface 180.

The CPU 108c receives a signal from a photo-sensor 110b which detects external light intensity and a key input switch 182 or a signal from a switch 166 or the like to control the sound/image processor 108b. In addition, the CPU 108c controls communication using a local area network through a communication interface 184. A memory 108d may be an SRAM or additionally provided with a recording medium 188 such as a hard disk. A main power supply circuit 186 supplies electric power necessary for operation of the cellular phone.

Components that can be mounted on the display module among the components illustrated in FIG. 16 are the controller 108a, the sound/image processor 108b, the CPU 108c, the memory 108d, the power supply circuit 108e, an electric power transistor 108f, the CCD module 110a, the photo-sensor 110b, the radio-frequency circuit 172, the base band processor 174, the auxiliary storage input interface 180, the communication interface 184, and the like.

It is to be noted that FIGS. 14A to 14C and 15 each show an external shape of the cellular phone as one example, and the cellular phone according to this embodiment mode can be changed into various modes depending on a function or a usage thereof. Subsequently, one mode of an electronic device according to the present invention will be described with reference to FIGS. 18A to 18D.

Figure 18A:
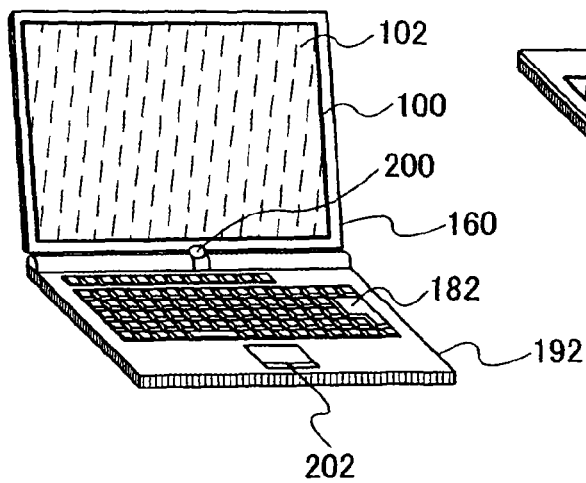
FIGS. 18A to 18D are views each showing a structure of an electronic device according to Embodiment Mode 10.
Figure 18B:
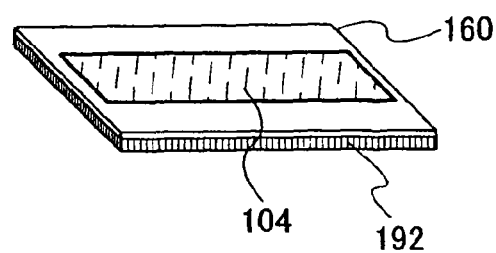

In a computer shown in FIGS. 18A and 18B, a display module 100 is stored in a chassis 190, a key input switch 182 and a pointing device 202 are provided in a chassis 192, and the both chassises are connected with a hinge 200. In FIG. 18A, the chassises are opened. Image display is performed on a first display panel 102, and a computer is operated using the key input switch 182 or the pointing device 202 while viewing the screen. The pointing device 202 is a device for inputting a coordinate location of the screen, and a mouse, a track bole, a track pad, a tablet, or the like is given.

In FIG. 18B, the chassises are closed, and display is performed on a second display panel 104. The state where the chassises are closed is convenient in a holding time or in the move carrying the computer. Time, a receiving condition of an e-mail, or other massage can be displayed on the second display panel 104.

In the display module 100 of this computer, in addition to the first display panel 102 forming the main screen and the second display panel 104 forming the sub-screen, an IC chip or a sensor chip is mounted on a back side of the first display panel 102 forming the main screen. Therefore, downsizing and a thin shape can be achieved, a peripheral frame (frame region) storing the display module 100 can be narrowed as shown in FIG. 18A, and a thin shape can be achieved as shown in FIG. 18B. Therefore, this computer is convenient to be put in a bag or the like and carried about.

Figure 18C:
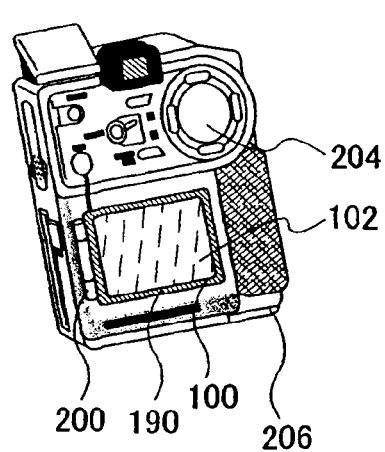
Figure 18D:
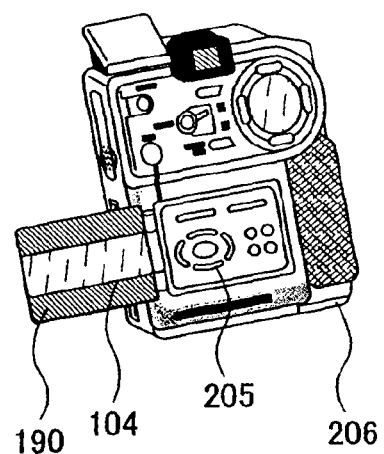

In a video camera shown in FIGS. 18C and 18D, a camera main body 206 includes a display module 100 stored in a chassis 190. The chassis 190 can be opened or closed with a hinge 200. When the chassis 190 is closed, i.e. the chassis 190 is stored in the camera main body 206 as shown in FIG. 18C, a first display panel 102 can be operated. An operation switch 204 is operated alone or operated while viewing a screen of the first display panel 102. At this time, an image of a subject can be captured by using the operation switch 204 in the camera main body 206.

In FIG. 18D, the chassis 190 is opened, and a screen of a second display panel 104 can be viewed. Here, by using an operation switch 205 in the camera main body 206, recorded data can be erased or a setting of the camera can be made while viewing the screen of the second display panel 104. In a case of such operation, the screen may be small. Therefore, when the first display panel 102 forming the main screen and the second display panel 104 forming the sub-screen are appropriately used, power consumption in using a camera can be reduced. It is to be noted that the structure shown in FIGS. 18C and 18D is not limited to a video camera and can also be applied to a digital still camera.

As described above, in this embodiment mode, the cellular phone, the computer, the video camera, and the like are illustrated; however, the present invention is not limited thereto, and various electronic devices provided with a display module can be achieved. For example, an electronic book, a personal digital assistant (PDA), a portable video game machine, a home video game machine, a navigation system, and the like can be achieved.

This application is based on Japanese Patent Application serial no. 2005-235002 filed in Japan Patent Office on Aug. 12, 2005, the entire contents of which are hereby incorporated by reference.

What is claimed is:

1. A display module comprising:
   a first substrate;
   a first transistor comprising:
     a first semiconductor layer over the first substrate;
     a first insulating layer over the first semiconductor layer; and
     a first gate electrode over the first insulating layer;
   a first light-emitting element comprising:
     a first electrode over and electrically connected to the first transistor;
     a first light-emitting layer over the first electrode; and
     a second electrode over the first light-emitting layer;
   a second substrate over the first light-emitting element;
   a first conductive member over the first substrate;
   a first flexible substrate provided with a first wiring, wherein the first flexible substrate is provided over and electrically connected to the first conductive member;
   a second conductive member over the second substrate; and
   a second flexible substrate provided with a second wiring, wherein the second flexible substrate is provided over and electrically connected to the second conductive member,
   wherein the first substrate and the second substrate are fixed with a sealing material,
   wherein the sealing material is provided between the first light-emitting element and the second substrate, and
   wherein the first conductive member and the second conductive member do not overlap with each other.

2. The display module according to claim 1, comprising:
   a second light-emitting element over the second substrate, wherein the second light-emitting element comprises:
     a third electrode over the second substrate;
     a second light-emitting layer over the third electrode; and
     a fourth electrode over the second light-emitting layer;
   a second transistor comprising:
     a second gate electrode;
     a second insulating layer over the second gate electrode; and
     a second semiconductor layer over the second insulating layer, wherein the second semiconductor layer is provided over and electrically connected to the second light-emitting element; and
   a third substrate over the second transistor.

3. The display module according to claim 1,
   wherein the first electrode is a transparent conductive film, and
   wherein the second electrode is a metal electrode.

4. The display module according to claim 1, further comprising an integrated circuit chip mounted over the second substrate.

5. The display module according to claim 1, wherein the first transistor further comprises a second gate electrode over the first insulating layer.

6. The display module according to claim 1, wherein the light emitted from the first light-emitting element is extracted from a first substrate side.

7. A cellular phone comprising:
   a chassis; and
   the display module according to claim 1, stored in the chassis.

8. An electronic device comprising;
   a chassis; and
   the display module according to claim 1, stored in the chassis.

9. A display module comprising:
   a first substrate;
   a first transistor comprising:
     a first semiconductor layer over the first substrate;
     a first insulating layer over the first semiconductor layer; and
     a first gate electrode over the first insulating layer;
   a first light-emitting element comprising:
     a first electrode over and electrically connected to the first transistor;
     a first light-emitting layer over the first electrode; and
     a second electrode over the first light-emitting layer;
   a second substrate over the first light-emitting element;
   a first conductive member over the first substrate;
   a first flexible substrate provided with a first wiring, wherein the first flexible substrate is provided over and electrically connected to the first conductive member;
   a second conductive member over the second substrate; and
   a second flexible substrate provided with a second wiring, wherein the second flexible substrate is provided over and electrically connected to the second conductive member,
   wherein the first substrate and the second substrate are fixed with a sealing material, wherein the second flexible substrate partly overlaps with the first flexible substrate, wherein the sealing material is provided between the first light-emitting element and the second substrate, and wherein the first conductive member and the second conductive member do not overlap with each other.

10. The display module according to claim 9, comprising:
a second light-emitting element over the second substrate, wherein the second light-emitting element comprises:
  a third electrode over the second substrate;
  a second light-emitting layer over the third electrode; and
  a fourth electrode over the second light-emitting layer;
a second transistor comprising:
  a second gate electrode;
  a second insulating layer over the second gate electrode; and
  a second semiconductor layer over the second insulating layer, wherein the second semiconductor layer is provided over and electrically connected to the second light-emitting element; and
a third substrate over the second transistor.

11. The display module according to claim 9,
wherein the first electrode is a transparent conductive film, and
wherein the second electrode is a metal electrode.

12. The display module according to claim 9, further comprising an integrated circuit chip mounted over the second substrate.

13. The display module according to claim 9, wherein the first transistor further comprises a second gate electrode over the first insulating layer.

14. The display module according to claim 9, wherein the light emitted from the first light-emitting element is extracted from a first substrate side.

15. A cellular phone comprising:
a chassis; and
the display module according to claim 9, stored in the chassis.

16. An electronic device comprising;
a chassis; and
the display module according to claim 9, stored in the chassis.

17. A display module comprising:
a first substrate;
a first transistor comprising:
  a first semiconductor layer over the first substrate;
  a first insulating layer over the first semiconductor layer; and
  a first gate electrode over the first insulating layer;
a first light-emitting element comprising:
  a first electrode over and electrically connected to the first transistor;
  a first light-emitting layer over the first electrode; and
  a second electrode over the first light-emitting layer;
a second substrate over the first light-emitting element;
a first conductive member over the first substrate;

a first flexible substrate provided with a first wiring, wherein the first flexible substrate is provided over and electrically connected to the first conductive member;
a second conductive member over the second substrate; and
a second flexible substrate provided with a second wiring, wherein the second flexible substrate is provided over and electrically connected to the second conductive member,
wherein the first substrate and the second substrate are fixed with a sealing material,
wherein the second flexible substrate partly overlaps with the first flexible substrate,
wherein the sealing material is provided between the first light-emitting element and the second substrate,
wherein the first conductive member and the second conductive member do not overlap with each other, and
wherein the first conductive member does not overlap with either the sealing material or the second substrate.

18. The display module according to claim 17, comprising:
a second light-emitting element over the second substrate, wherein the second light-emitting element comprises:
  a third electrode over the second substrate;
  a second light-emitting layer over the third electrode; and
  a fourth electrode over the second light-emitting layer;
a second transistor comprising:
  a second gate electrode;
  a second insulating layer over the second gate electrode; and
  a second semiconductor layer over the second insulating layer, wherein the second semiconductor layer is provided over and electrically connected to the second light-emitting element; and
a third substrate over the second transistor.

19. The display module according to claim 17,
wherein the first electrode is a transparent conductive film, and
wherein the second electrode is a metal electrode.

20. The display module according to claim 17, further comprising an integrated circuit chip mounted over the second substrate.

21. The display module according to claim 17, wherein the first transistor further comprises a second gate electrode over the first insulating layer.

22. The display module according to claim 17, wherein the light emitted from the first light-emitting element is extracted from a first substrate side.

23. A cellular phone comprising:
a chassis; and
the display module according to claim 17, stored in the chassis.

24. An electronic device comprising;
a chassis; and
the display module according to claim 17, stored in the chassis.

* * * * *